(12) United States Patent
Kuo et al.

(10) Patent No.: US 10,978,412 B2
(45) Date of Patent: Apr. 13, 2021

(54) MANUFACTURING METHOD OF PACKAGE STRUCTURE

(71) Applicant: Taiwan Semiconductor Manufacturing Co., Ltd., Hsinchu (TW)

(72) Inventors: Hung-Jui Kuo, Hsinchu (TW); Hui-Jung Tsai, Hsinchu (TW); Tsao-Lun Chang, Hsinchu (TW); Tai-Min Chang, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/526,974

(22) Filed: Jul. 30, 2019

(65) Prior Publication Data
US 2021/0035928 A1    Feb. 4, 2021

(51) Int. Cl.
| | |
|---|---|
| *H01L 23/66* | (2006.01) |
| *H01L 23/538* | (2006.01) |
| *H01L 23/00* | (2006.01) |
| *H01L 21/48* | (2006.01) |
| *H01L 21/56* | (2006.01) |
| *H01Q 1/38* | (2006.01) |
| *H01Q 21/00* | (2006.01) |
| *C23F 1/16* | (2006.01) |
| *H01L 23/31* | (2006.01) |

(52) U.S. Cl.
CPC .............. *H01L 23/66* (2013.01); *C23F 1/16* (2013.01); *H01L 21/4853* (2013.01); *H01L 21/4857* (2013.01); *H01L 21/565* (2013.01); *H01L 21/568* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01Q 1/38* (2013.01); *H01Q 21/0087* (2013.01); *H01L 2223/6677* (2013.01); *H01L 2224/214* (2013.01)

(58) Field of Classification Search
CPC . H01L 23/66; H01L 21/4853; H01L 23/5383; H01L 21/565; H01L 21/4857; H01L 23/5386; H01L 21/568; H01L 24/20; H01L 23/3128; H01L 23/5389; H01L 24/19; H01L 2224/214; H01L 2223/6677; C23F 1/16; H01Q 21/0087; H01Q 1/38
USPC .......................................................... 438/25
See application file for complete search history.

(56) References Cited

U.S. PATENT DOCUMENTS

| | | | |
|---|---|---|---|
| 5,160,600 A * | 11/1992 | Patel | ....................... C23C 18/24 205/167 |
| 9,000,584 B2 | 4/2015 | Lin et al. | |
| 9,048,222 B2 * | 6/2015 | Hung | .................. H01L 23/5384 |
| 9,048,233 B2 | 6/2015 | Wu et al. | |
| 9,064,879 B2 | 6/2015 | Hung et al. | |

(Continued)

*Primary Examiner* — Vu A Vu
(74) *Attorney, Agent, or Firm* — JCIPRNET

(57) ABSTRACT

A method including the following steps is provided. A seed layer is formed. Conductive patterns are formed on the seed layer. An etching process with an etchant is performed to remove a portion of the seed layer exposed by the conductive patterns, wherein the etchant includes: 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent, and a balance amount of a solvent.

20 Claims, 25 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |

\* cited by examiner

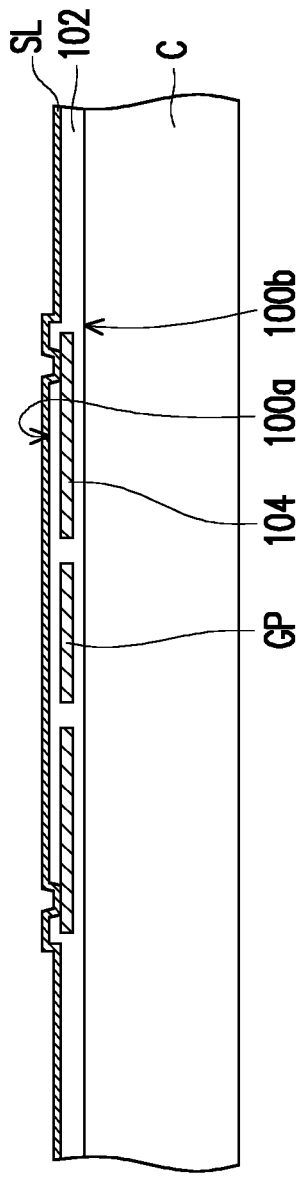
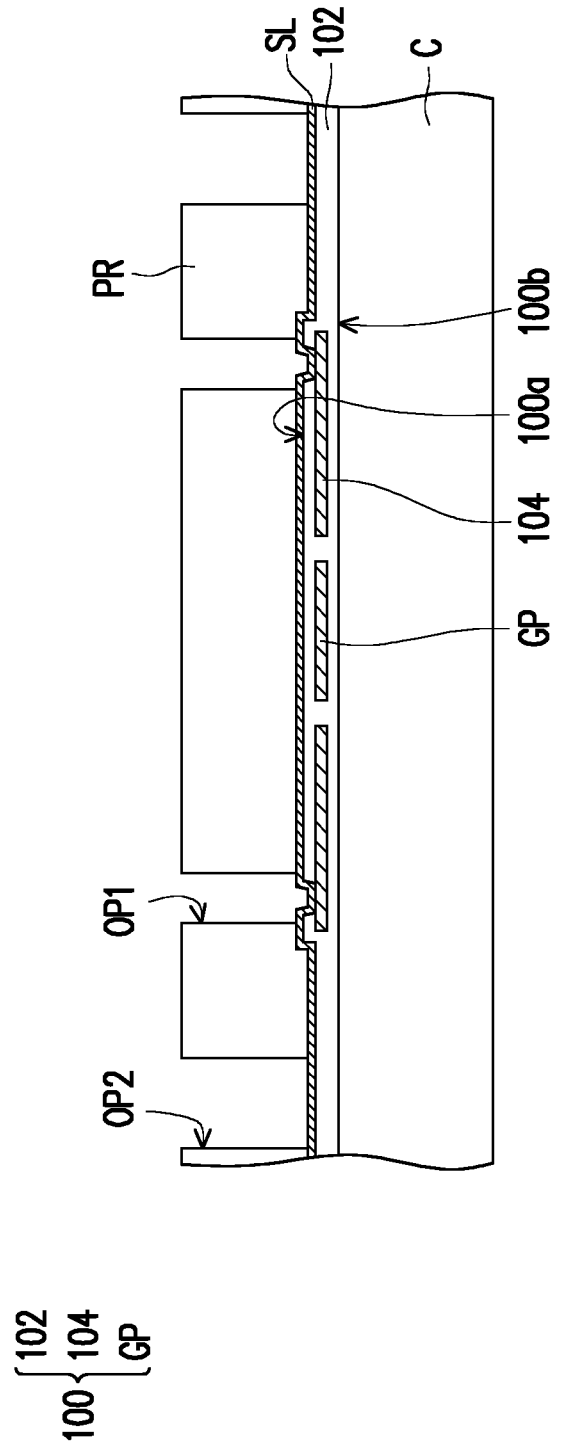
FIG. 1A
FIG. 1B

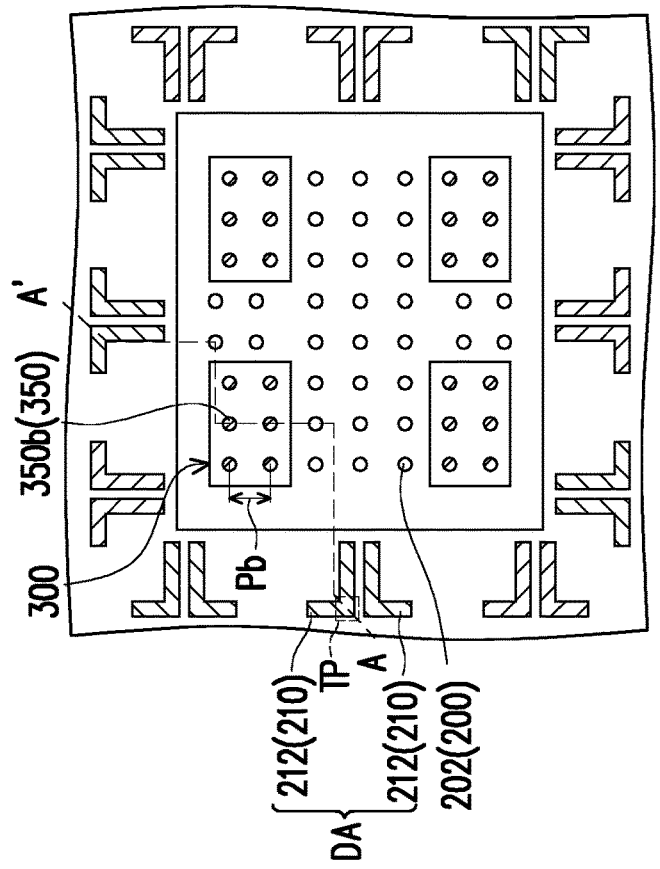
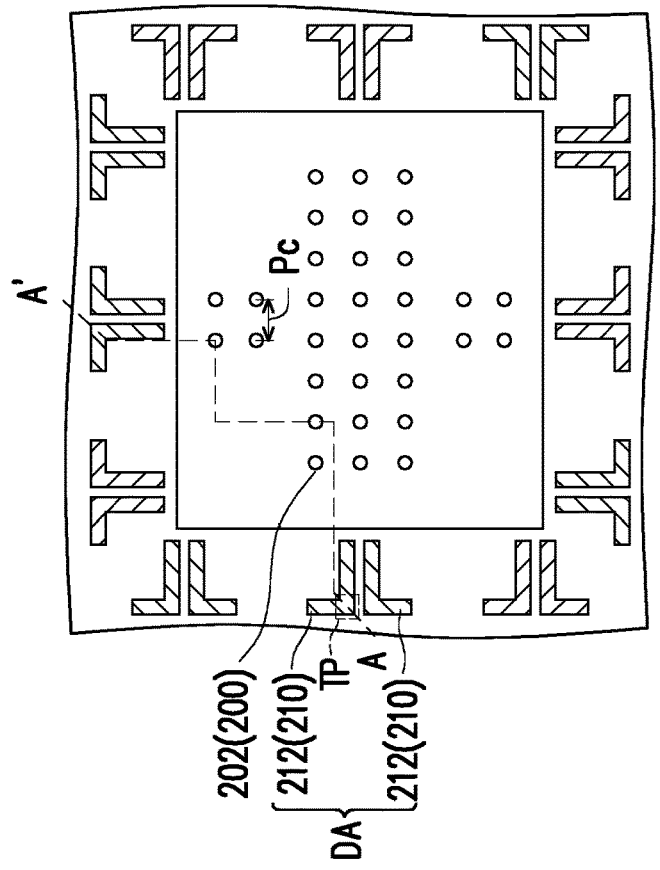
FIG. 2B
FIG. 2A

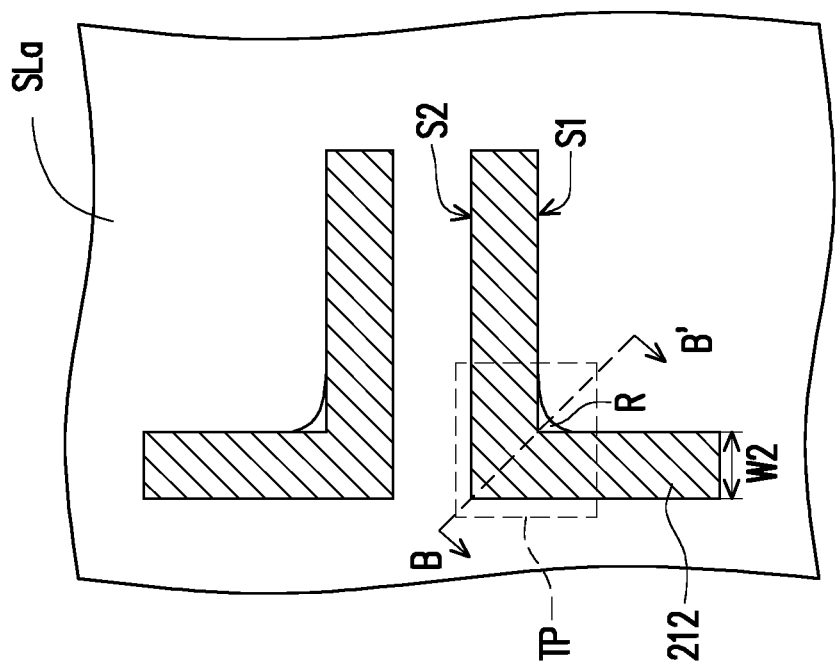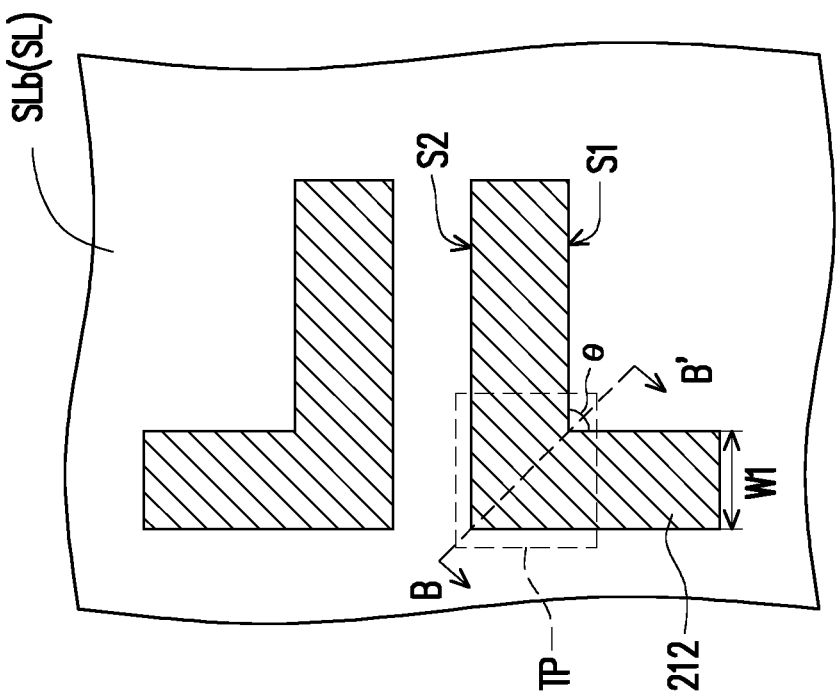
FIG. 3B
FIG. 3A

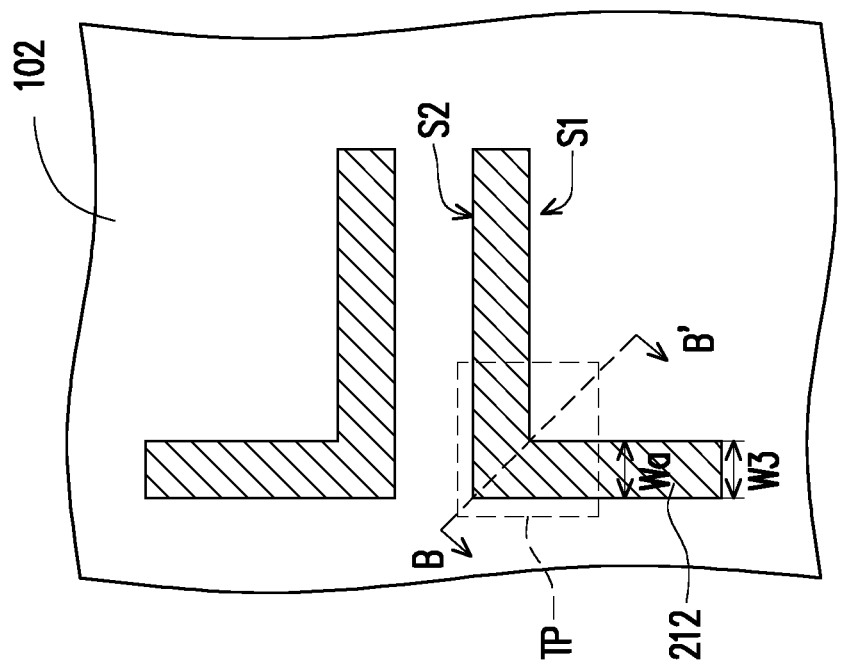
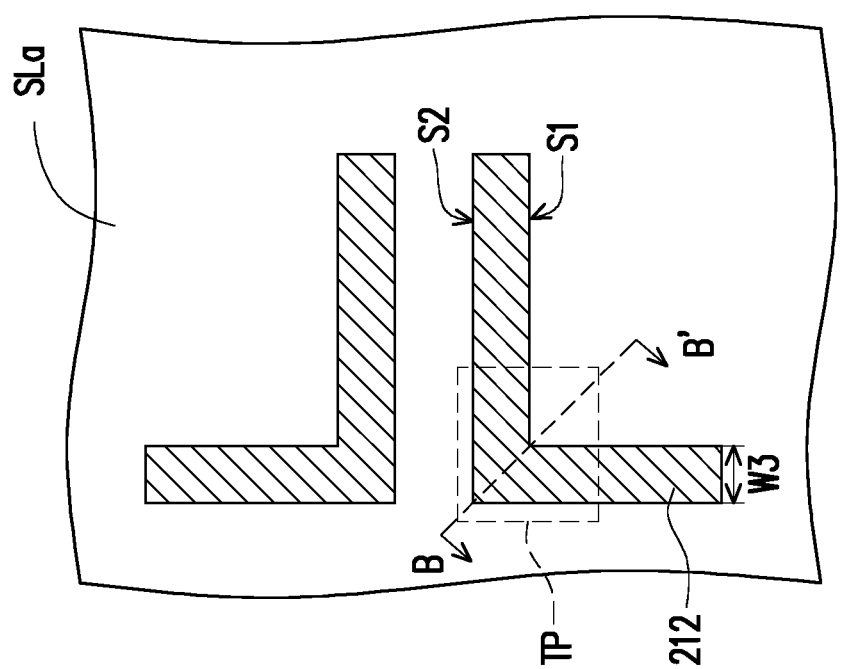
FIG. 3C
FIG. 3D

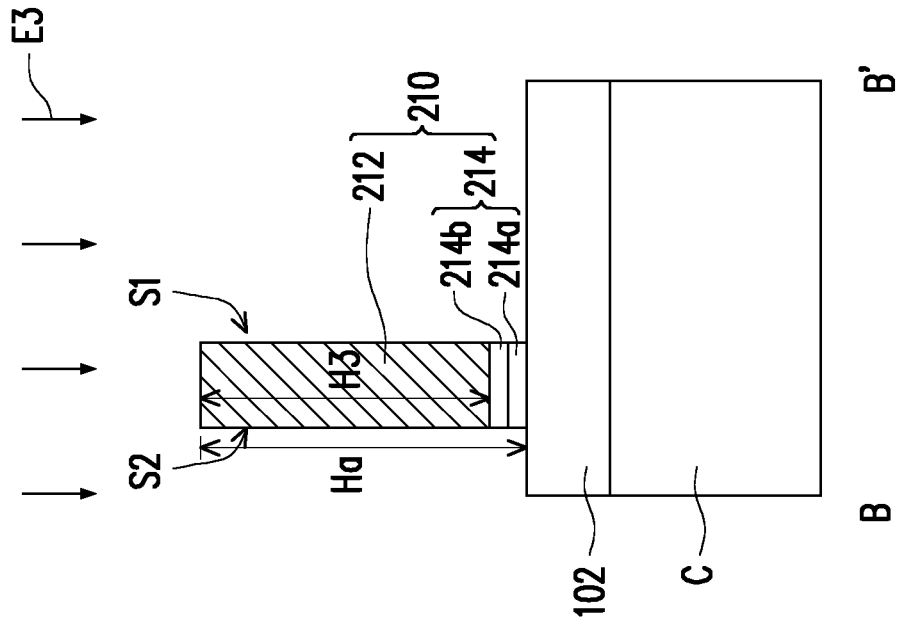
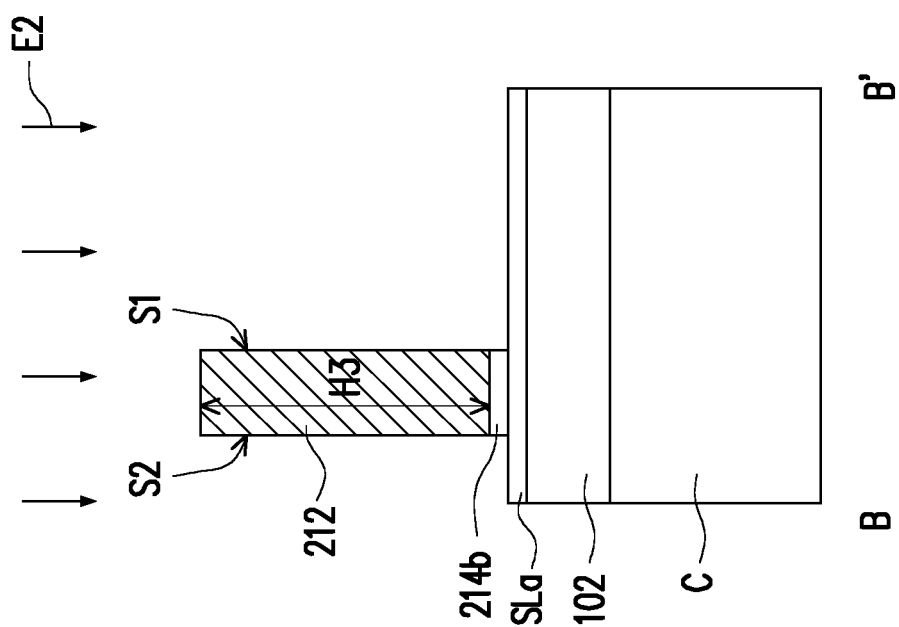
FIG. 4C
FIG. 4D

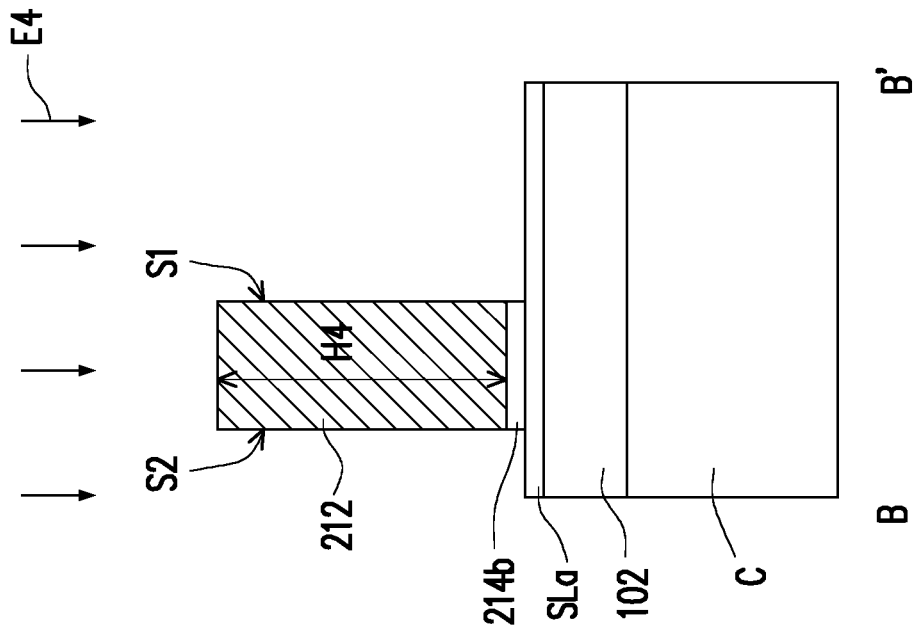
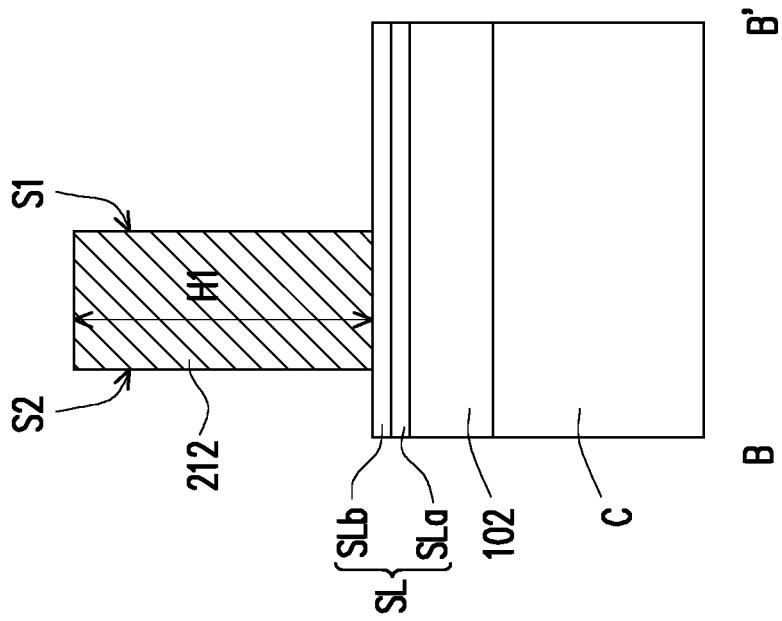
FIG. 6A
FIG. 6B

MANUFACTURING METHOD OF PACKAGE STRUCTURE

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices (e.g. antenna) or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1L are schematic cross-sectional views illustrating a manufacturing process of a package structure in accordance with some embodiments of the disclosure.

FIG. 2A to FIG. 2B are schematic top views illustrating intermediate stages of the manufacturing process of the package structure in FIG. 1D and FIG. 1E.

FIG. 3A to FIG. 3D are schematic top views illustrating a manufacturing process of antenna patterns in FIG. 1D in accordance with some embodiments of the disclosure.

FIG. 4A to FIG. 4D are cross-sectional views illustrating a manufacturing process of antenna patterns in FIG. 1D in accordance with some embodiments of the disclosure.

FIG. 6A to FIG. 6C are cross-sectional views illustrating a manufacturing process of antenna patterns in FIG. 1D in accordance with some alternative embodiments of the disclosure.

DETAILED DESCRIPTION

Figure 1C:
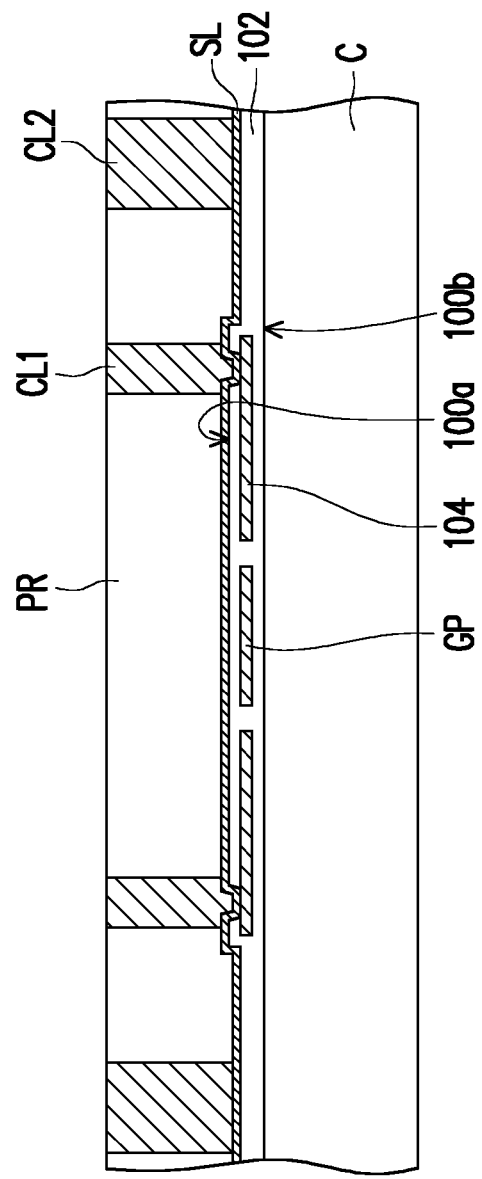

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1L are schematic cross-sectional views illustrating a manufacturing process of a package structure in accordance with some embodiments of the disclosure. FIG. 2A to FIG. 2B are schematic top views illustrating intermediate stages of the manufacturing process of the package structure in FIG. 1D and FIG. 1E. The schematic cross-sectional views illustrated in FIG. 1A to FIG. 1L are taken along the cross-section line A-A' as shown in FIG. 2A and FIG. 2B.

Referring to FIG. 1A, a carrier C is provided. In some embodiments, the carrier C is a glass substrate. Subsequently, a redistribution structure 100 is formed over the carrier C. In some embodiments, the redistribution structure 100 includes a dielectric layer 102, a ground plane GP, and conductive patterns 104. The redistribution structure 100 has a first surface 100a and a second surface 100b opposite to the first surface 100a. At this stage, the first surface 100a faces upward while the second surface 100b faces the carrier C. In some embodiments, a de-bonding layer (not shown) may be provided between the dielectric layer 102 and the carrier C. The de-bonding layer may be a light-to-heat conversion (LTHC) release layer and may aid the removal of the carrier C in the subsequent processes. In some embodiments, the redistribution structure 100 may be referred to as a backside redistribution structure.

In some embodiments, the dielectric layer 102 may be a polymer layer made of polybenzoxazole (PBO), polyimide (PI), benzocyclobutene (BCB), a combination thereof, or the like. In some embodiments, the dielectric layer 102 may include multiple dielectric layers. For example, the redistribution structure 100 may be configured such that the ground plane GP and the conductive patterns 104 are sandwiched between two adjacent dielectric layers of the dielectric layer 102. That is to say, the ground plane GP and the conductive patterns 104 may be considered as being embedded in the dielectric layer 102. In some embodiments, the ground plane GP may be electrically connected to a ground. In some embodiments, the conductive patterns 104 may be electrically connected to other subsequently formed conductive elements for signal transmission. The ground plane GP and the conductive patterns 104 may be formed by a same photolithography and etching process at the same time. In other words, in some embodiments, the ground plane GP and the conductive patterns 104 may be collectively referred to as a conductive pattern layer of the redistribution structure 100. In some embodiments, the ground plane GP and the conductive patterns 104 includes copper, nickel, titanium, a combination thereof, or the like. It should be noted that the number of the dielectric layers (the dielectric layer 102) and/or the conductive pattern layer (i.e. the ground plane GP and the conductive patterns 104) is not limited by the illustration presented in FIG. 1A. In some alternative embodiments, more dielectric layers and/or more conductive pattern layers may be formed to stack alternately.

As illustrated in FIG. 1A, the dielectric layer 102 is patterned to form a plurality of openings exposing at least a portion of the conductive patterns 104. A seed layer SL is conformally formed on the first surface 100a of the redistribution structure 100. For example, the seed layer SL is formed on the dielectric layer 102 and the conductive patterns 104 exposed by the openings. In some embodiments, the seed layer SL may be a single layer. In some embodiments, the seed layer SL may be a composite layer formed by different materials. In some embodiments, the material of the seed layer SL may include copper, copper alloys, titanium, titanium nitride, tantalum, tantalum nitride, a combination thereof, or other suitable materials. In some embodiments, the seed layer SL includes a titanium/copper composite layer. In some embodiments, the thickness of the seed layer SL may range from about 10 nm to about 1000 nm. In some embodiments, the seed layer SL is formed by a sputtering process.

Referring to FIG. 1B, a photoresist layer PR is formed on the seed layer SL. In some embodiments, the photoresist layer PR has a plurality of first openings OP1 and a plurality of second openings OP2. The first openings OP1 and the second openings OP2 expose the underlying seed layer SL. In some embodiments, the first openings OP1 and the second openings OP2 are formed through a photolithography process. As shown in FIG. 1B, each sidewall corresponding to each second opening OP1 and each second opening OP2 of the photoresist layer PR is in a vertical profile, but the disclosure is not limited thereto. In some alternative embodiments, a reentrant profile with an undercut may be observed in a lower sidewall corresponding to each second opening OP1 and each second opening OP2 of the photoresist layer PR.

Referring to FIG. 1C, a conductive material CL1 is formed on the seed layer SL and filled into the first openings OP1. Similarly, a conductive material CL2 is formed on the seed layer SL and filled into the second openings OP2. In some embodiments, a material of the conductive material CL1 and a material of the conductive material CL2 may be the same or different. In some embodiments, the material of the conductive material CL1 and the material of the conductive material CL2 may include copper or copper alloys. In some embodiments, the material of the seed layer SL may be the same as or similar to the material of the conductive material CL1 and the material of the conductive material CL2. For example, in one embodiment, the material of the seed layer SL, the material of the conductive material CL1 and the material of the conductive material CL2 all include copper; and in another one embodiment, the material of the seed layer SL includes copper alloys, and the material of the conductive material CL1 and the material of the conductive material CL2 both include copper. In some embodiments, the conductive material CL1 and the conductive material CL2 may be formed through electroplating, electroless-plating, immersion plating, or the like. That is to say, even if the seed layer SL, the conductive material CL1 and the conductive material CL2 includes the same material, the said material of the seed layer SL is formed through different method from the said material of the conductive material CL1 and the said material of the conductive material CL2.

Figure 1D:
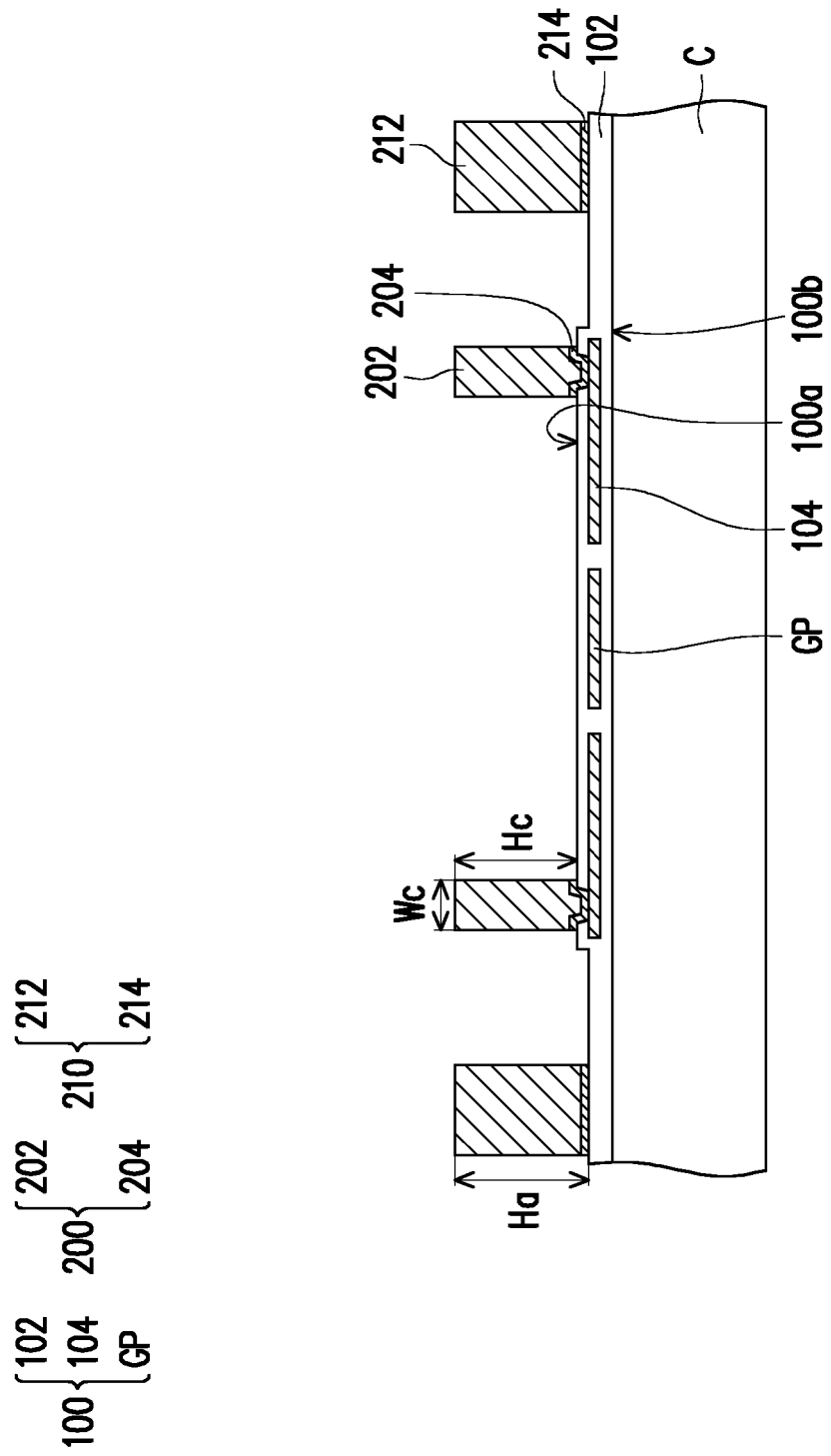
Figure 1E:
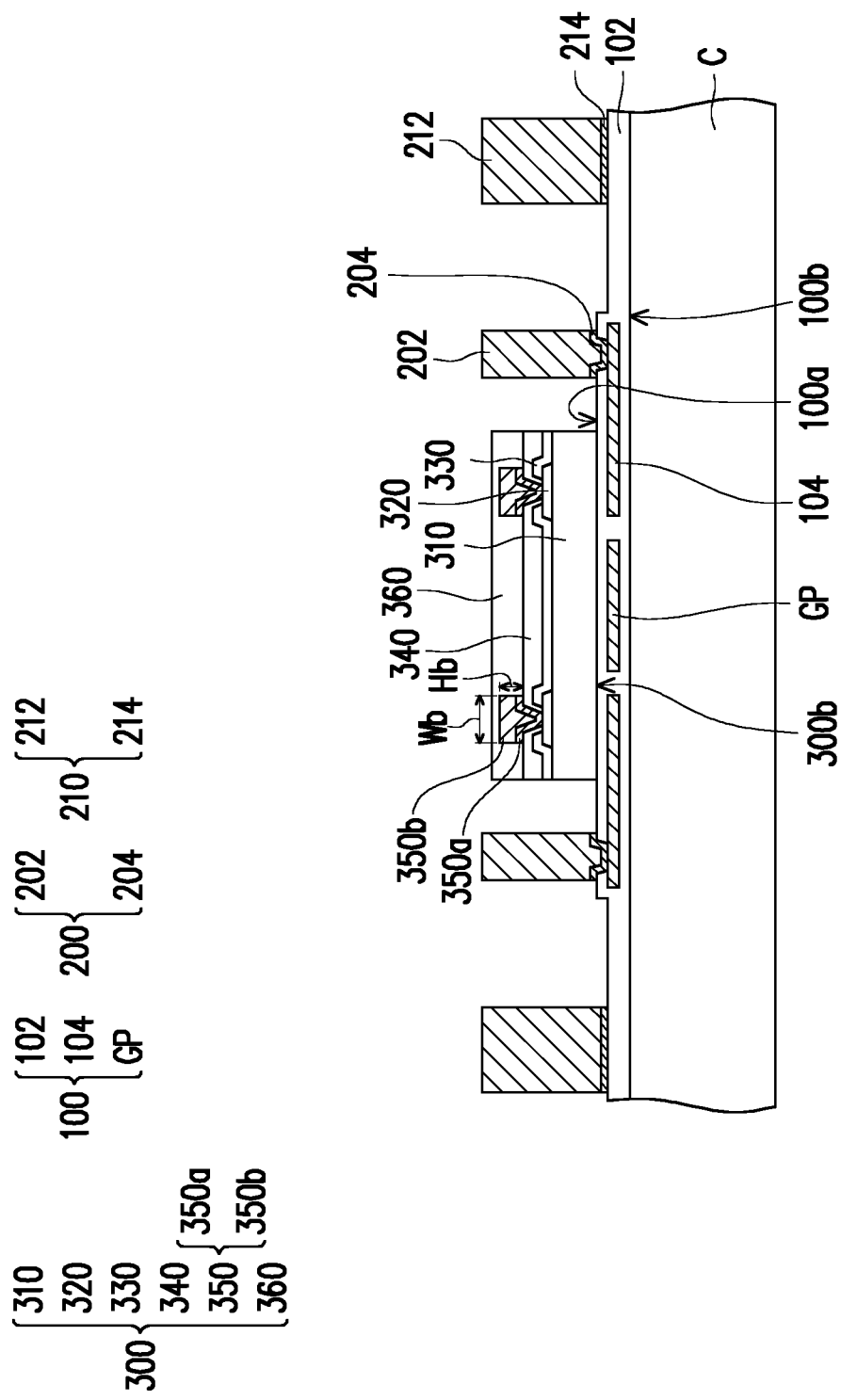

Referring to FIG. 1C and FIG. 1D, the photoresist layer PR is removed to render a plurality of conductive patterns 202 and a plurality of conductive patterns 212. Since the conductive patterns 202 are originated from the conductive material CL1, the conductive patterns 202 inherent the same material as the conductive material CL1. Similarly, since the conductive patterns 212 are originated from the conductive material CL2, the conductive patterns 212 inherent the same material as the conductive material CL2. That is to say, in some embodiments, the material of the conductive patterns 202 and the material of the conductive patterns 212 may include copper or copper alloys. In some embodiments, each conductive pattern 202 is formed to have a circular shape from a top view, as shown in FIG. 2A. However, the disclosure is not limited thereto. In some alternative embodiments, each conductive pattern 202 may exhibit a polygonal shape from the top view. In some embodiments, each conductive pattern 212 is formed to have a shape similar to letter "L" from the top view, as shown in FIG. 2A. Specifically, referring to FIG. 2A, each conductive patterns 212 is formed with a turning portion TP. In some embodiments, the photoresist layer PR is removed through, for example, etching, ashing, or other suitable removal processes.

Subsequently, referring to FIG. 1C and FIG. 1D, a portion of the seed layer SL exposed by the conductive patterns 202 and the conductive patterns 212 is removed to form a plurality of seed layer patterns 204 and a plurality of seed layer patterns 214. That is to say, the seed layer patterns 204 and the seed layer patterns 214 are originated from a portion of the seed layer SL covered by the conductive patterns 202 and the conductive patterns 212. On the other hand, the conductive patterns 202 and the conductive patterns 212 are serve as a mask for partially removing the seed layer SL. As shown in FIG. 1D and FIG. 2A, the contour of the seed layer patterns 204 is substantially identical to the contour of the conductive patterns 202, and the contour of the seed layer patterns 214 is substantially identical to the contour of the conductive patterns 212. That is to say, in some embodiments, each first seed layer pattern 204 is formed to have a circular shape from a top view, and each seed layer pattern 214 is formed to have a shape similar to letter "L" from the top view. In some embodiments, the seed layer SL is partially removed through an etching process.

In some embodiments, the seed layer patterns 204 and the conductive patterns 202 are collectively referred to as conductive through vias 200. On the other hand, the seed layer patterns 214 and the conductive patterns 212 are collectively referred to as antenna patterns 210. As illustrated in FIG. 1D, the conductive through vias 200 are electrically connected to the conductive patterns 104, and the antenna patterns 210 are electrically insulated from the conductive patterns 104 and the ground plane GP. In some embodiments, the conductive through vias 200 are formed in an array, as shown in FIG. 2A. In some embodiments, the antenna patterns 210 are arranged to form a plurality of dipole antennas DA. Referring to FIG. 2A, the dipole antenna DA includes a pair of two adjacent antenna patterns 210.

Referring to FIG. 1D and FIG. 2A, a portion of the seed layer SL exposed by the conductive patterns 202 and the conductive patterns 212 is removed sufficiently. That is to say, even if the seed layer SL, the conductive patterns 202 and the conductive patterns 212 include the same or similar material, and each conductive pattern 212 has L-shaped structure, the etching process for forming the seed layer patterns 204 and the seed layer patterns 214 has great etching efficiency. The descriptions with respect to the manufacturing process of the antenna patterns 210 will be discussed in greater detail below in conjunction with FIGS. 3A-3D, 4A-4D, 5A-5C, and 6A-6C.

FIG. 3A to FIG. 3D are schematic top views illustrating a manufacturing process of antenna patterns in FIG. 1D in accordance with some embodiments of the disclosure. FIG. 4A to FIG. 4D are cross-sectional views illustrating a manufacturing process of antenna patterns in FIG. 1D in accordance with some embodiments of the disclosure. The schematic cross-sectional views illustrated in FIG. 4A to FIG. 4D are taken along the cross-section line B-B' as shown in FIG. 3A and FIG. 3D.

Figure 4B:
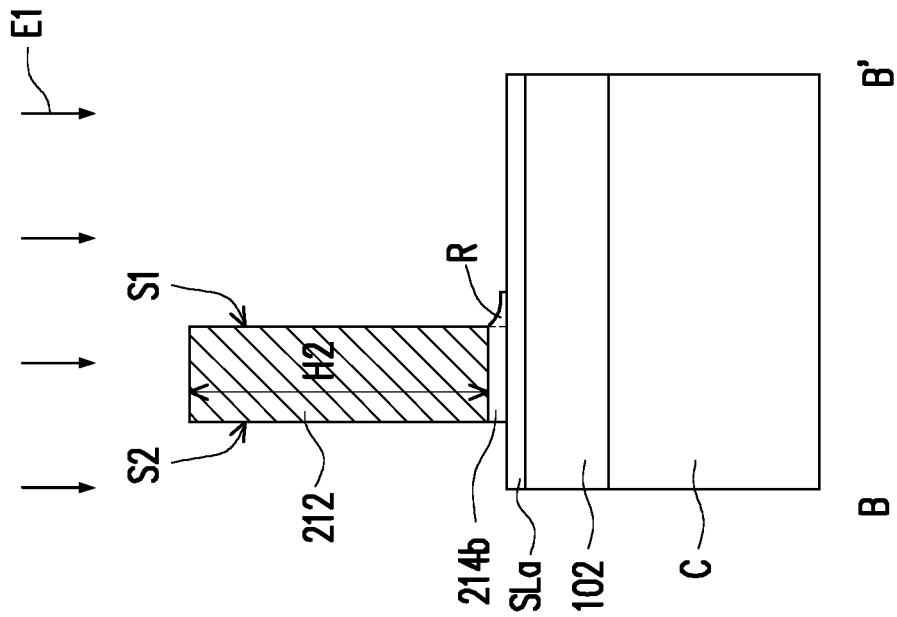
Figure 4A:
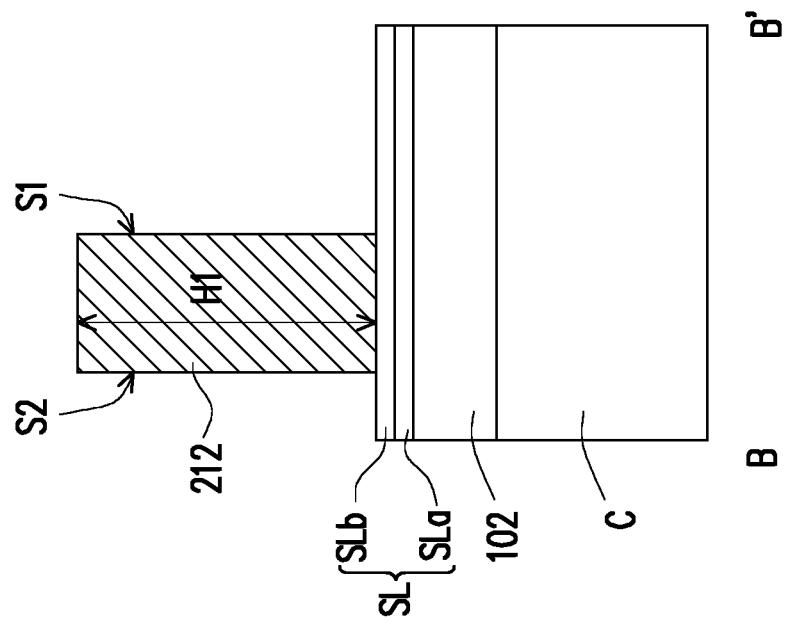

Referring to FIG. 3A and FIG. 4A, the seed layer SL includes a first seed layer SLa and a second seed layer SLb, wherein second seed layer SLb is disposed on the first seed layer SLa. In some embodiments, a material of the first seed layer SLa may include titanium, titanium nitride, tantalum, or tantalum nitride. In some embodiments, a material of the second seed layer SLb may include copper or copper alloys. In view of this, the material of the second seed layer SLb is the same as or similar to the material of the conductive patterns 212. As mentioned above, because the seed layer SL is formed through different method from the conductive patterns 212, the second seed layer SLb may have different etching property from the conductive patterns 212 to the same etchant.

Referring to FIG. 3A, the cross-section line B-B' extends through the turning portion TP of one of the conductive patterns 212, and thus FIG. 4A illustrates the cross-sectional view corresponding to the turning portion TP of the conductive pattern 212 and the region in proximity to the turning portion TP of the conductive pattern 212. In some embodiments, each conductive pattern 212 has a first sidewall S1 and a second sidewall S2 opposite to the first sidewall S1, wherein the first sidewall S1 at the turning portion TP has an included angle θ of about 90° or less. In some embodiments, a height H1 of each conductive pattern 212 ranges between about 30 μm and about 250 μm. In some embodiments, a width W1 of each conductive pattern 212 ranges between about 30 μm and about 210 μm. In some embodiments, an aspect ratio (i.e., a ratio of the height H1 to the width W1) of each conductive pattern 212 ranges between about 1 and about 8.

Referring to FIG. 3B and FIG. 4B, an etching process E1 is performed on the second seed layer SLb using the conductive patterns 212 as a mask to form a plurality of seed layer patterns 214b covered by the conductive patterns 212 and a plurality of seed layer patterns R exposed by the conductive patterns 212. That is to say, during the etching process E1, a portion of the second seed layer SLb exposed by the conductive patterns 212 is removed, and another portion of the second seed layer SLb exposed by the conductive patterns 212 (i.e. the seed layer patterns R) is remained. On the other hand, the contour of the seed layer patterns 214b is substantially identical to the contour of the conductive patterns 212. In some embodiments, the seed layer pattern R is located in proximity to the turning portion TP of the conductive pattern 212. In detail, as shown in FIG. 3B and FIG. 4B, the seed layer pattern R is located in proximity to the first sidewall S1 at the turning portion TP of the conductive pattern 212. That is to say, the etchant used in the etching process E1 cannot reach the seed layer patterns R around the first sidewalls S1 at the turning portions TP due to the topography. As such, for the etchant used in the etching process E1, the wetting ability thereof to the second seed layer SLb in proximity to the first sidewall S1 at the turning portion TP is not good.

Moreover, during the etching process E1, the conductive patterns 212 are also partially removed. Specifically, after the etching process E1 is performed, the height H1 and the width W1 of each conductive pattern 212 are reduced to render a height H2 and a width W2, as shown in FIG. 3B and FIG. 4B. As such, for the etchant used in the etching process E1, the material of the conductive patterns 212 has low etching selectivity with respect to the material of the second seed layer SLb. In some embodiments, for the etchant used in the etching process E1, the etching selectivity of the material of the conductive patterns 212 to the material of the second seed layer SLb is substantially 1. In some embodiments, the height H2 of each conductive pattern 212 ranges between about 19 μm and about 244 μm. In some embodiments, the width W2 of each conductive pattern 212 ranges between about 20 μm and about 200 μm. In some embodiments, the ratio of the height H2 of each conductive pattern 212 to the height H1 of each conductive pattern 212 ranges between about 0.63 and about 0.97. In some embodiments, the ratio of the width W2 of each conductive pattern 212 to the width W1 of each conductive pattern 212 ranges between about 0.67 and about 0.95. In some embodiments, after the etching process E1 is performed, an aspect ratio (i.e., a ratio of the height H2 to the width W2) of each conductive pattern 212 ranges between about 1 and about 10.

In some embodiments, the etchant used in the etching process E1 includes: 0.1 wt % to 10 wt % of phosphoric acid ($H_3PO_4$), 0.1 wt % to 10 wt % of hydrogen peroxide ($H_2O_2$), and a balance amount of a solvent. In some embodiments, the solvent may be water. In some embodiments, the process time of the etching process E1 ranges between about 10 seconds and about 1000 seconds. In some embodiments, the process temperature of the etching process E1 ranges between about 20° C. and about 50° C.

Referring to FIG. 3C and FIG. 4C, an etching process E2 is performed to remove the seed layer patterns R and remain the seed layer patterns 214b. In detail, the seed layer patterns R located in proximity to the turning portions TP are sufficiently removed without the presence of residue. That is to say, the etchant used in the etching process E2 can reach the seed layer patterns R around the first sidewalls S1 at the turning portions TP. As such, for the etchant used in the etching process E2, the wetting ability thereof to the seed layer patterns R in proximity to the first sidewalls S1 at the turning portions TP is good. As mentioned above, the seed layer patterns R are exposed by the conductive patterns 212, so the conductive patterns 212 may serve as a mask for removing the seed layer patterns R. As shown in FIG. 3C and FIG. 4C, the sidewalls of the seed layer pattern 214b corresponding to the first sidewall S1 and the second sidewall S2 of the conductive pattern 212 are in a vertical profile, but the disclosure is not limited thereto. In some alternative embodiments, a reentrant profile with an undercut may be observed in a lower sidewall of the seed layer pattern 214b.

Moreover, during the etching process E2, the conductive patterns 212 is slightly etched while the seed layer patterns R are sufficiently removed. As such, for the etchant used in the etching process E2, the material of the conductive patterns 212 has high etching selectivity with respect to the material of the seed layer patterns R. In some embodiments, for the etchant used in the etching process E2, the etching selectivity of the material of the seed layer patterns R to the material of the conductive patterns 212 ranges from larger than about 1 to about 5, which means that the etching rate ratio of the material of the seed layer patterns R to the material of the conductive patterns 212 ranges from larger than about 1 to about 5. In some other embodiments, for the etchant used in the etching process E2, the etching selectivity of the material of the seed layer patterns R to the material of the conductive patterns 212 ranges from about 1.3 to about 3.5. Specifically, after the etching process E2 is performed, each conductive pattern 212 has a height H3 slightly different from the height H2 and a width W3 slightly different from the width W2. In some embodiments, the height H3 of each conductive pattern 212 ranges between about 17 µm and about 242 µm. In some embodiments, the width W3 of each conductive pattern 212 ranges between about 15 µm and about 197 µm. In some embodiments, the ratio of the height H3 of each conductive pattern 212 to the height H2 of each conductive pattern 212 ranges between about 0.91 and about 0.99. In some embodiments, the ratio of the width W3 of each conductive pattern 212 to the width W2 of each conductive pattern 212 ranges between about 0.75 and about 0.99. In some embodiments, after the etching process E2 is performed, an aspect ratio (i.e., a ratio of the height H3 to the width W3) of each conductive pattern 212 ranges between about 1 and about 10. The mechanism for removing slightly the conductive pattern 212 during the etching process E2 can be refer to the descriptions with respect to FIGS. 10A-10E.

In some embodiments, the etchant used in the etching process E2 includes: 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent, and a balance amount of a solvent. For the said etchant including 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent and a balance amount of a solvent, the etching selectivity of the material of the seed layer patterns R to the material of the conductive patterns 212 ranges from larger than about 1 to about 5. In some other embodiments, the etchant used in the etching process E2 includes: 0.5 wt % to 6 wt % of phosphoric acid ($H_3PO_4$), 0.5 wt % to 6 wt % of hydrogen peroxide ($H_2O_2$), 1000 ppm to 6000 ppm of a protective agent, 1000 ppm to 6000 ppm of a wetting agent, and a balance amount of a solvent. For the said etchant including 0.5 wt % to 6 wt % of phosphoric acid ($H_3PO_4$), 0.5 wt % to 6 wt % of hydrogen peroxide ($H_2O_2$), 1000 ppm to 6000 ppm of a protective agent, 1000 ppm to 6000 ppm of a wetting agent and a balance amount of a solvent, the etching selectivity of the material of the seed layer patterns R to the material of the conductive patterns 212 ranges from about 1.3 to about 3.5.

In some embodiments, the protective agent may include alkylamine, amino acid or azole compound. In some embodiments, examples of alkylamine include dodecyl amine, octyl amine, hexadecyl amine, and tetraethylenepentamine. In some embodiments, examples of amino acid include cysteine, proline, phenyl alanine, and histidine. In some embodiments, examples of azole compound include benzotriazole, tetrazole, and phenyl tetrazole. In some embodiments, the wetting agent may compound with aliphatic carbon chain. In some embodiments, the compound with aliphatic carbon chain may include non-ionic type compound or anionic type compound. In some embodiments, examples of non-ionic type compound include polyvinylpyrrolidone, poly(oxyethylene), polysorbate, and lauryl glucoside. In some embodiments, examples of anionic type compound include sodium dodecyl sulfate, sodium stearate, dioctyl sodium sulfosuccinate, and perfluorooctanesulfonic acid. In some embodiments, the solvent may be water. In some embodiments, the process time of the etching process E2 is different from the process time of the etching process E1. In some embodiments, the process time of the etching process E2 is shorter than the process time of the etching process E1. In some embodiments, the process time of the etching process E2 ranges between about 10 seconds and about 300 seconds. In some embodiments, the process temperature of the etching process E2 is substantially same as the process temperature of the etching process E1. In some embodiments, the process temperature of the etching process E2 ranges between about 20° C. and about 50° C.

As mentioned above, during the etching process E2 with the etchant including: 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent, and a balance amount of a solvent, the seed layer patterns R located in proximity to the turning portions TP are sufficiently removed without the presence of residue, while the conductive patterns 212 is slightly etched. As such, during the etching process E2 with said etchant, residue-free profile is rendered around the turning portions TP, while the etching bias of the conductive patterns 212 is substantially eased.

Referring to FIG. 3D and FIG. 4D, an etching process E3 is performed on the second seed layer SLa using the conductive patterns 212 as a mask to form a plurality of seed layer patterns 214a covered by the conductive patterns 212. Since the material of the second seed layer SLa is different from the material of the conductive patterns 212, during the etching process E3, the conductive patterns 212 remain substantially intact while the second seed layer SLa is partially removed. That is to say, after the etching process E3 is performed, each conductive pattern 212 still has the height H3 and the width W3, and the contour of the seed layer patterns 214a is substantially identical to the contour of the conductive patterns 212.

In some embodiments, the etchant used in the etching process E3 includes: 0.1 wt % to 5 wt % of hydrogen fluoride (HF), and a balance amount of a solvent. In the etching process E3, due to the etchant including: 0.1 wt % to 5 wt % of hydrogen fluoride (HF) and a balance amount of a solvent, the conductive patterns 212 remain substantially intact while the second seed layer SLa is partially removed. In some embodiments, the solvent may be water. In some embodiments, the process time of the etching process E3 ranges between about 10 seconds and about 200 seconds. In some embodiments, the process temperature of the etching process E3 ranges between about 20° C. and about 50° C. As shown in FIG. 3D and FIG. 4D, the sidewalls of the seed layer pattern 214a corresponding to the first sidewall S1 and the second sidewall S2 of the conductive pattern 212 are in a vertical profile, but the disclosure is not limited thereto. In some alternative embodiments, a reentrant profile with an undercut may be observed in a lower sidewall of the seed layer pattern 214a.

Moreover, the seed layer pattern 214a and the seed layer pattern 214b constitute the second seed layer pattern 214. Accordingly, during the etching process E3, the antenna patterns 210 are formed. In some embodiments, a height Ha of each antenna pattern 210 ranges between about 20 μm and about 245 μm. In some embodiments, a width Wa of each antenna pattern 210 ranges between about 20 μm and about 200 μm. In some embodiments, the width Wa of each antenna pattern 210 is substantially equal to the width W3 of each conductive pattern 212. In some embodiments, an aspect ratio (i.e., a ratio of the height Ha to the width Wa) of each antenna pattern 210 ranges between about 1 and about 10. In certain embodiments, the aspect ratio of each antenna pattern 210 ranges between about 8 and about 10, i.e., during the etching process E3, the antenna patterns 210 are formed to have high aspect ratio.

As mentioned above, during the etching process E2, the seed layer patterns R are sufficiently removed without the presence of residue while the conductive patterns 212 is slightly etched, and during the etching process E3, the second seed layer SLa is partially removed to form the seed layer patterns 214a while the conductive patterns 212 remain substantially intact. As such, during the execution of the etching process E2 and the etching process E3, the etchant used in the etching process E2 and the etchant used in the etching process E3 allow residue-free profile to be rendered around the antenna patterns 210, while the etching bias of the conductive patterns 212 to be substantially eased and the critical dimension (CD) control of the antenna patterns 210 to be optimized. On the other hand, during the execution of the etching process E2 and the etching process E3, the etchant used in the etching process E2 and the etchant used in the etching process E3 allow the pattern of the conductive patterns 212 to be accurately transferred onto the seed layer SL. Therefore, the performance and the quality of the subsequently formed package structure 10 may be ensured.

Although FIGS. 3A-3D and 4A-4D only illustrate the manufacturing process of the antenna patterns 210, according to the descriptions with respect to FIG. 1D and FIG. 2A, those skilled in the art should understand that during the execution of the etching process E1, the etching process E2 and the etching process E3, the conductive through vias 200 also are formed. It is noted that those skilled in the art should understand that it may be deduced from the descriptions with respect to FIGS. 3A-3D and 4A-4D that during the execution of the etching process E1, the etching process E2 and the etching process E3, the conductive through vias 200 are formed without the presence of residue around themselves and the critical dimension (CD) control of the conductive through vias 200 is optimized. In some embodiments, a pitch Pc of two adjacent conductive through vias 200 ranges between about 20 μm and about 400 μm. In certain embodiments, the pitch Pc of two adjacent conductive through vias 200 ranges between about 20 μm and about 50 μm, i.e., during the execution of the etching process E1, the etching process E2 and the etching process E3, the conductive through vias 200 are formed to have high distribution density. In some embodiments, a height He of each conductive through via 200 ranges between about 20 μm and about 250 μm. In some embodiments, a width Wc of each conductive through via 200 ranges between about 20 μm and about 250 μm. In the case that the each conductive through via 200 has a circular shape from a top view (as shown in FIG. 2A), then the width Wc may be the diameter. In the case that each conductive through via 200 has a polygonal shape from the top view, then the width Wc may be the maximum dimension. In some embodiments, an aspect ratio (i.e., a ratio of the height He to the width Wc) of each conductive through via 200 ranges between about 1 and about 10. In certain embodiments, the aspect ratio of each conductive through via 200 ranges between about 8 and about 10, i.e., during the execution of the etching process E1, the etching process E2 and the etching process E3, the conductive through vias 200 are formed to have high aspect ratio.

Moreover, it is noted that the seed layer SL is exemplified as having the first seed layer SLa and the second seed layer SLb in the embodiments of FIGS. 3A-3D and 4A-4D, but those skilled in the art should understand that it may be deduced from the descriptions with respect to FIGS. 3A-3D and 4A-4D that when the seed layer SL is a single layer of copper or copper alloys, during the execution of the etching process E1 and the etching process E2, the antenna patterns 210 are formed without the presence of residue around the first sidewalls S1 at the turning portions TP and the critical dimension (CD) control of the antenna patterns 210 is optimized.

Figure 5B:
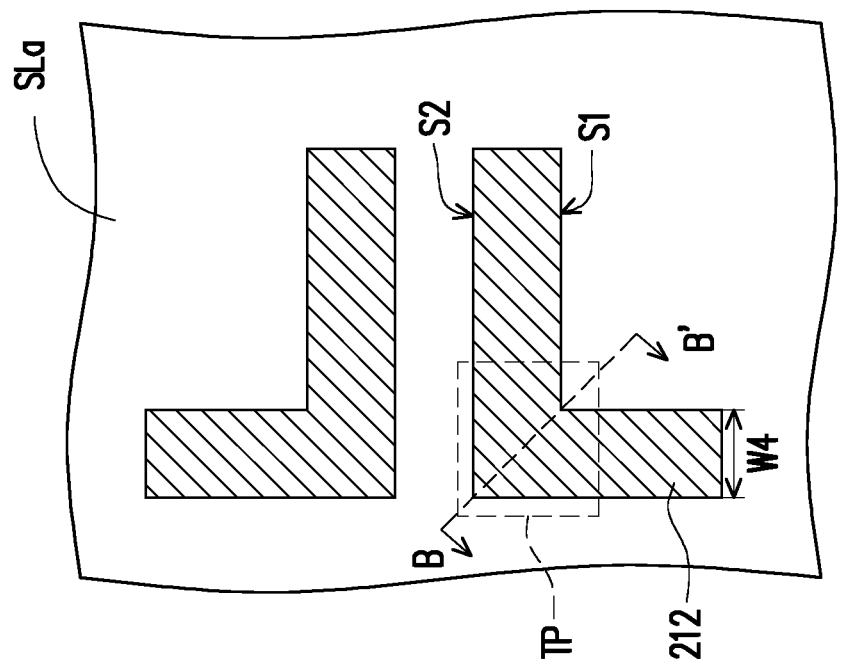
FIG. 5A to FIG. 5C are schematic top views illustrating a manufacturing process of antenna patterns in FIG. 1D in accordance with some alternative embodiments of the disclosure.
Figure 5A:
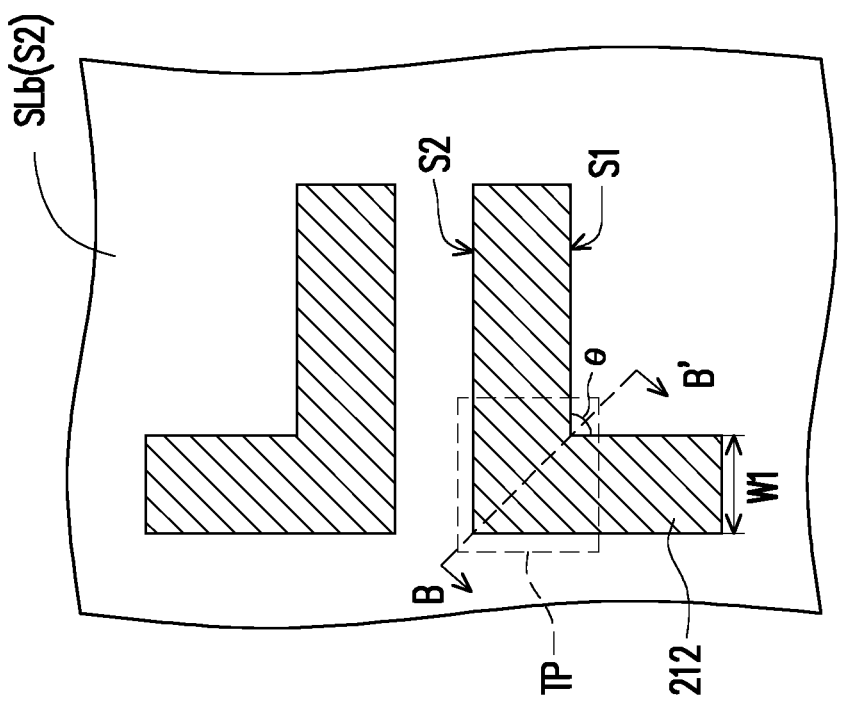
Figure 5C:
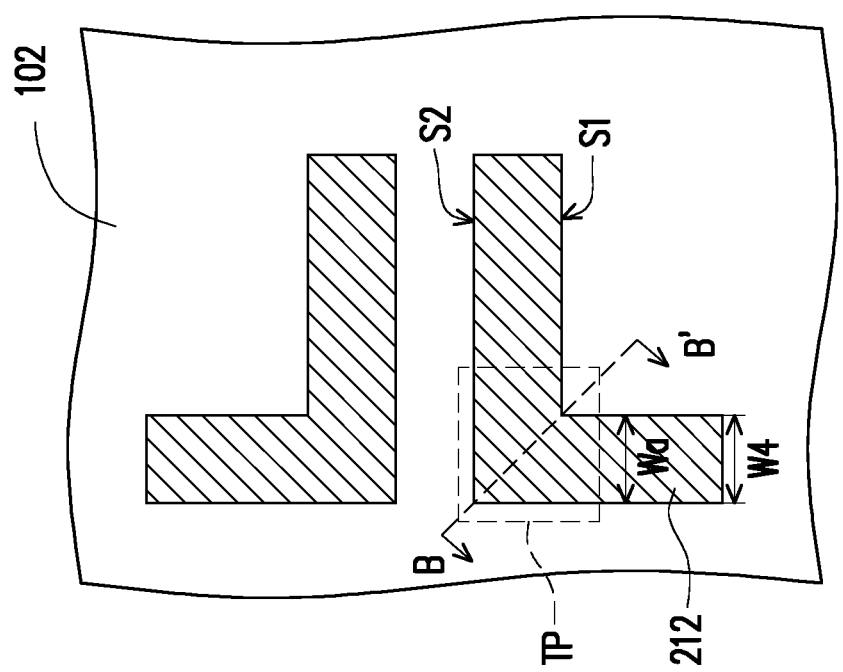
Figure 6C:
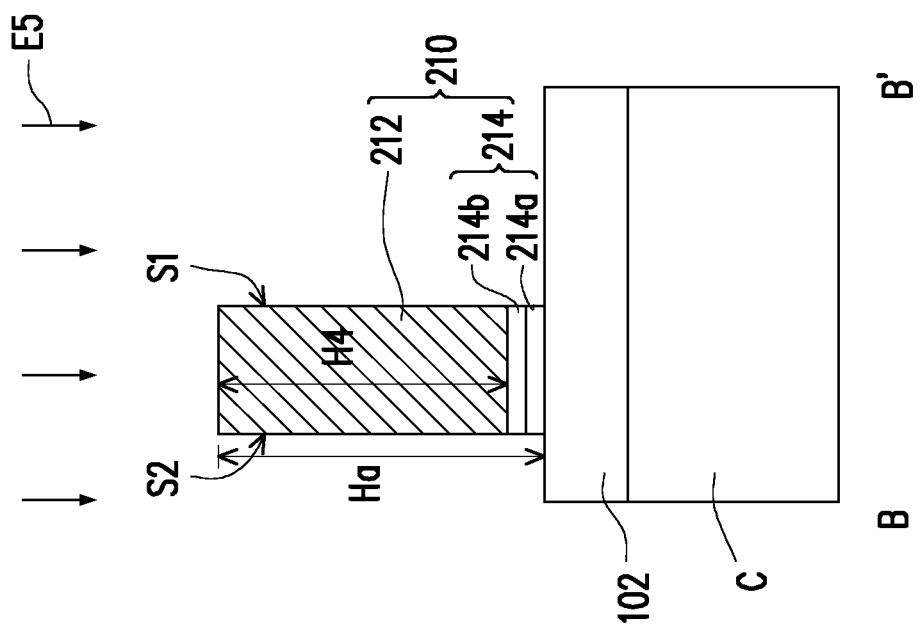

FIG. 5A to FIG. 5C are schematic top views illustrating a manufacturing process of antenna patterns in FIG. 1D in accordance with some alternative embodiments of the disclosure. FIG. 6A to FIG. 6C are cross-sectional views illustrating a manufacturing process of antenna patterns in FIG. 1D in accordance with some alternative embodiments of the disclosure. The schematic cross-sectional views illustrated in FIG. 6A to FIG. 6C are taken along the cross-section line B-B' as shown in FIG. 5A and FIG. 5C.

Referring to FIG. 5A and FIG. 6A, the seed layer SL includes a first seed layer SLa and a second seed layer SLb, wherein second seed layer SLb is disposed on the first seed layer SLa. In some embodiments, a material of the first seed layer SLa may include titanium, titanium nitride, tantalum, or tantalum nitride. In some embodiments, a material of the second seed layer SLb may include copper or copper alloys. In view of this, the material of the second seed layer SLb is the same as or similar to the material of the conductive patterns 212. As mentioned above, because the seed layer SL is formed through different method from the conductive patterns 212, the second seed layer SLb may have different etching property from the conductive patterns 212 to the same etchant.

Referring to FIG. 5A, the cross-section line B-B' extends through the turning portion TP of one of the conductive patterns 212, and thus FIG. 6A illustrates the cross-sectional view corresponding to the turning portion TP of the conductive pattern 212 and the region in proximity to the turning portion TP of the conductive pattern 212. In some embodiments, each conductive pattern 212 has a first sidewall S1 and a second sidewall S2 opposite to the first sidewall S1, wherein the first sidewall S1 at the turning portion TP has an included angle θ of about 90° or less. In some embodiments, a height H1 of each conductive pattern 212 ranges between about 20 μm and about 250 μm. In some embodiments, a width W1 of each conductive pattern 212 ranges between about 20 μm and about 210 μm. In some embodiments, an aspect ratio (i.e., a ratio of the height H1 to the width W1) of each conductive pattern 212 ranges between about 1 and about 10.

Referring to FIG. 5B and FIG. 6B, an etching process E4 is performed on the second seed layer SLb using the conductive patterns 212 as a mask to form a plurality of seed layer patterns 214b covered by the conductive patterns 212. In detail, during the etching process E4, a portion of the second seed layer SLb exposed by the conductive patterns 212 is sufficiently removed without the presence of residue, while another portion of the second seed layer SLb covered by the conductive patterns 212 (i.e. the seed layer patterns 214b) is remained. That is to say, the etchant used in the etching process E4 has good wetting ability, such that a portion of the second seed layer SLb even located in proximity to the first sidewall S1 at the turning portions TP of the conductive pattern 212 is sufficiently removed. On the other hand, the contour of the seed layer patterns 214b is substantially identical to the contour of the conductive patterns 212. As shown in FIG. 5B and FIG. 6B, the sidewalls of the seed layer pattern 214b corresponding to the first sidewall S1 and the second sidewall S2 of the conductive pattern 212 are in a vertical profile, but the disclosure is not limited thereto. In some alternative embodiments, a reentrant profile with an undercut may be observed in a lower sidewall of the seed layer pattern 214b.

Moreover, during the etching process E4, the conductive patterns 212 is slightly etched while a portion of the second seed layer SLb exposed by the conductive patterns 212 is sufficiently removed. As such, for the etchant used in the etching process E4, the material of the conductive patterns 212 has high etching selectivity with respect to the material of the second seed layer SLb. In some embodiments, for the etchant used in the etching process E4, the etching selectivity of the material of second seed layer SLb to the material of the conductive patterns 212 ranges from larger than about 1 to about 5. In some other embodiments, for the etchant used in the etching process E4, the etching selectivity of the material of the second seed layer SLb to the material of the conductive patterns 212 ranges from about 1.3 to about 3.5. Specifically, after the etching process E4 is performed, each conductive pattern 212 has a height H4 slightly different from the height H1 and a width W4 slightly different from the width W1. In some embodiments, the height H4 of each conductive pattern 212 ranges between about 28 μm and about 248 μm. In some embodiments, the width W4 of each conductive pattern 212 ranges between about 25 μm and about 208 μm. In some embodiments, the ratio of the height H4 of each conductive pattern 212 to the height H1 of each conductive pattern 212 ranges between about 0.93 and about 0.99. In some embodiments, the ratio of the width W4 of each conductive pattern 212 to the width W1 of each conductive pattern 212 ranges between about 0.83 and about 0.99. In some embodiments, after the etching process E4 is performed, an aspect ratio (i.e., a ratio of the height H4 to the width W4) of each conductive pattern 212 ranges between about 1 and about 9.9. Further, as shown in FIG. 6B and FIG. 6A, the shape of each conductive pattern 212 during the etching process E4 is substantially similar with the shape of each conductive pattern 212 before the etching process E4 is performed. The mechanism for removing slightly the conductive pattern 212 during the etching process E4 can be refer to the descriptions with respect to FIGS. 10A-10E.

In some embodiments, the etchant used in the etching process E4 includes: 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent, and a balance amount of a solvent. For the said etchant including 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent and a balance amount of a solvent, the etching selectivity of the material of second seed layer SLb to the material of the conductive patterns 212 ranges from larger than about 1 to about 5. In some other embodiments, the etchant used in the etching process E4 includes: 0.5 wt % to 6 wt % of phosphoric acid ($H_3PO_4$), 0.5 wt % to 6 wt % of hydrogen peroxide ($H_2O_2$), 1000 ppm to 6000 ppm of a protective agent, 1000 ppm to 6000 ppm of a wetting agent, and a balance amount of a solvent. For the said etchant including 0.5 wt % to 6 wt % of phosphoric acid ($H_3PO_4$), 0.5 wt % to 6 wt % of hydrogen peroxide ($H_2O_2$), 1000 ppm to 6000 ppm of a protective agent, 1000 ppm to 6000 ppm of a wetting agent and a balance amount of a solvent, the etching selectivity of the material of second seed layer SLb to the material of the conductive patterns 212 ranges from about 1.3 to about 3.5.

In some embodiments, the protective agent may include alkylamine, amino acid or azole compound. In some embodiments, examples of alkylamine include dodecyl amine, octyl amine, hexadecyl amine, and tetraethylenepentamine. In some embodiments, examples of amino acid include cysteine, proline, phenyl alanine, and histidine. In some embodiments, examples of azole compound include benzotriazole, tetrazole, and phenyl tetrazole. In some embodiments, the wetting agent may compound with aliphatic carbon chain. In some embodiments, the compound with aliphatic carbon chain may include non-ionic type compound or anionic type compound. In some embodiments, examples of non-ionic type compound include polyvinylpyrrolidone, poly(oxyethylene), polysorbate, and lauryl glucoside. In some embodiments, examples of anionic type compound include sodium dodecyl sulfate, sodium stearate, dioctyl sodium sulfosuccinate, and perfluorooctanesulfonic acid. In some embodiments, the solvent may be water. In some embodiments, the process time of the etching process E4 ranges between about 20 seconds and about 500 seconds. In some embodiments, the process temperature of the etching process E4 ranges between about 20° C. and about 50° C.

As mentioned above, during the etching process E4 with the etchant including: 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent, and a balance amount of a solvent, a portion of the second seed layer SLb exposed by the conductive patterns 212 is sufficiently removed without the presence of residue, while the conductive patterns 212 is slightly etched. As such, during the etching process E4 with said etchant, residue-free profile is rendered around the turning portions TP, while the etching bias of the conductive patterns 212 is substantially eased.

Referring to FIG. 5C and FIG. 6C, an etching process E5 is performed on the second seed layer SLa using the conductive patterns 212 as a mask to form a plurality of seed layer patterns 214a covered by the conductive patterns 212. Since the material of the second seed layer SLa is different from the material of the conductive patterns 212, during the etching process E5, the conductive patterns 212 remain substantially intact while the second seed layer SLa is partially removed. That is to say, after the etching process E5 is performed, each conductive pattern 212 still has the height H4 and the width W4, and the contour of the seed layer patterns 214a is substantially identical to the contour of the conductive patterns 212.

In some embodiments, the etchant used in the etching process E5 includes: 0.1 wt % to 5 wt % of hydrogen fluoride (HF), and a balance amount of a solvent. In some embodiments, the process time of the etching process E5 ranges between about 10 seconds and about 200 seconds. In some embodiments, the process temperature of the etching process E5 ranges between about 20° C. and about 50° C. As shown in FIG. 5C and FIG. 6C, the sidewalls of the seed layer pattern 214a corresponding to the first sidewall S1 and the second sidewall S2 of the conductive pattern 212 are in a vertical profile, but the disclosure is not limited thereto. In some alternative embodiments, a reentrant profile with an undercut may be observed in a lower sidewall of the seed layer pattern 214a.

Moreover, the seed layer pattern 214a and the seed layer pattern 214b constitute the second seed layer pattern 214. Accordingly, during the etching process E5, the antenna patterns 210 are formed. In some embodiments, a height Ha of each antenna pattern 210 ranges between about 20 μm and about 245 μm. In some embodiments, a width Wa of each antenna pattern 210 ranges between about 20 μm and about 200 μm. In some embodiments, the width Wa of each antenna pattern 210 is substantially equal to the width W4 of each conductive pattern 212. In some embodiments, an aspect ratio (i.e., a ratio of the height Ha to the width Wa) of each antenna pattern 210 ranges between about 1 and about 10. In certain embodiments, the aspect ratio of each antenna pattern 210 ranges between about 8 and about 10, i.e., during the etching process E5, the antenna patterns 210 are formed to have high aspect ratio.

As mentioned above, during the etching process E4, the second seed layer SLb is partially removed to form the seed layer patterns 214b without the presence of residue while the conductive patterns 212 remain substantially intact, and during the etching process E5, the second seed layer SLa is partially removed to form the seed layer patterns 214a while the conductive patterns 212 remain substantially intact. As such, during the execution of the etching process E4 and the etching process E5, the etchant used in the etching process E4 and the etchant used in the etching process E5 allow residue-free profile to be rendered around the antenna patterns 210, while the etching bias of the conductive patterns 212 to be substantially eased and the critical dimension (CD) control of the antenna patterns 210 to be optimized. On the other hand, during the execution of the etching process E4 and the etching process E5, the etchant used in the etching process E4 and the etchant used in the etching process E5 allow the pattern of the conductive patterns 212 to be accurately transferred onto the seed layer SL. Therefore, the performance and the quality of the subsequently formed package structure 10 may be ensured.

Although FIGS. 5A-5C and 6A-6C only illustrate the manufacturing process of the antenna patterns 210, those skilled in the art should understand that during the execution of the etching process E4 and the etching process E5, the conductive through vias 200 also are formed. It is noted that those skilled in the art should understand that it may be deduced from the descriptions with respect to FIGS. 5A-5C and 6A-6C that during the execution of the etching process E4 and the etching process E5, the conductive through vias 200 are formed without the presence of residue around themselves and the critical dimension (CD) control of the conductive through vias 200 is optimized. In some embodiments, a pitch Pc of two adjacent conductive through vias 200 ranges between about 20 μm and about 400 μm. In certain embodiments, the pitch Pc of two adjacent conductive through vias 200 ranges between about 20 μm and about 50 μm, i.e., during the execution of the etching process E4 and the etching process E5, the conductive through vias 200 are formed to have high distribution density. In some embodiments, a height He of each conductive through via 200 ranges between about 20 μm and about 250 μm. In some embodiments, a width Wc of each conductive through via 200 ranges between about 20 μm and about 250 μm. In the case that the each conductive through via 200 has a circular shape from a top view (as shown in FIG. 2A), then the width Wc may be the diameter. In the case that each conductive through via 200 has a polygonal shape from the top view, then the width Wc may be the maximum dimension. In some embodiments, an aspect ratio (i.e., a ratio of the height He to the width Wc) of each conductive through via 200 ranges between about 1 and about 10. In certain embodiments, the aspect ratio of each conductive through via 200 ranges between about 8 and about 10, i.e., during the execution of the etching process E4 and the etching process E5, the conductive through vias 200 are formed to have high aspect ratio.

Moreover, it is noted that the seed layer SL is exemplified as having the first seed layer SLa and the second seed layer SLb in the embodiments of FIGS. 5A-5C and 6A-6C, but those skilled in the art should understand that it may be deduced from the descriptions with respect to FIGS. 5A-5C and 6A-6C that when the seed layer SL is a single layer of copper or copper alloys, during the execution of the etching process E4, the antenna patterns 210 are formed without the presence of residue around the first sidewalls S1 at the turning portions TP and the critical dimension (CD) control of the antenna patterns 210 is optimized.

Referring back to FIG. 1E and FIG. 2B, dies 300 (or integrated circuit components) may be picked and placed onto the first surface 100a of the redistribution structure 100. Each die 300, for example, includes a semiconductor substrate 310, a plurality of conductive pads 320, a passivation layer 330, a post-passivation layer 340, a plurality of conductive pillars 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post passivation layer 340. The post-passivation layer 340 may be a polyimide (PI) layer, a polybenzoxazole (PBO) layer, or a dielectric layer formed by other suitable polymers. In addition, the conductive pillars 350 are formed on the conductive pads 320. In some embodiments, the conductive pillars 350 in each die 300 are formed in an array, as shown in FIG. 2B. In some embodiments, the conductive pillars 350 may be plated copper pillars. In some embodiments, each conductive pillar 350 includes a seed layer pattern 350a and a conductive pattern 350b. It is noted that according to the descriptions with respect to FIGS. 1A-1D, 3A-3D, 4A-4D, 5A-5C and 6A-6C, those skilled in the art should understand that the method described above in conjunction with FIGS. 3A-3D and 4A-4D or the method described above in conjunction with FIGS. 5A-5C and 6A-6C can be applied to manufacture the conductive pillars 350 without the presence of residue around themselves. In this way, the conductive pillars 350 can be formed without the presence of residue around themselves and the critical dimension (CD) control of the conductive pillars 350 can be optimized. In some embodiments, a pitch Pb of two adjacent conductive pillars 350 ranges between about 10 µm and about 80 µm. In certain embodiments, the pitch Pb of two adjacent conductive pillars 350 ranges between about 10 µm and about 40 µm. That is to say, when the method described above in conjunction with FIGS. 3A-3D and 4A-4D or the method described above in conjunction with FIGS. 5A-5C and 6A-6C is applied to manufacture the conductive pillars 350, the conductive pillars 350 can be formed to have high distribution density. Further, in some embodiments, a height Hb of each conductive pillar 350 ranges between about 5 µm and about 200 µm, and a width Wb of each conductive pillar 350 ranges between about 2 µm and about 50 µm. Furthermore, in some embodiments, an aspect ratio (i.e., a ratio of the height Hb to the width Wb) of each conductive pillar 350 ranges between about 1 and about 10. In certain embodiments, the aspect ratio of each conductive pillar 350 ranges between about 6 and about 10. That is to say, when the method described above in conjunction with FIGS. 3A-3D and 4A-4D or the method described above in conjunction with FIGS. 5A-5C and 6A-6C is applied to manufacture the conductive pillars 350, the conductive pillars 350 can be formed to have high aspect ratio. The protection layer 360 is formed on the post-passivation layer 340 so as to cover the conductive pillars 350.

In some embodiments, each die 300 is attached (or adhered) to the dielectric layer 102 through a die attach film (DAF; not shown). In some embodiments, the dies 300 may be picked and placed onto the dielectric layer 102 after the formation of the conductive through vias 200 and/or the antenna patterns 210. However, the disclosure is not limited thereto. In some alternative embodiments, one or more die(s) 300 may be picked and placed onto the dielectric layer 102 prior to the formation of the conductive through vias 200 and/or the antenna patterns 210.

Figure 1F:
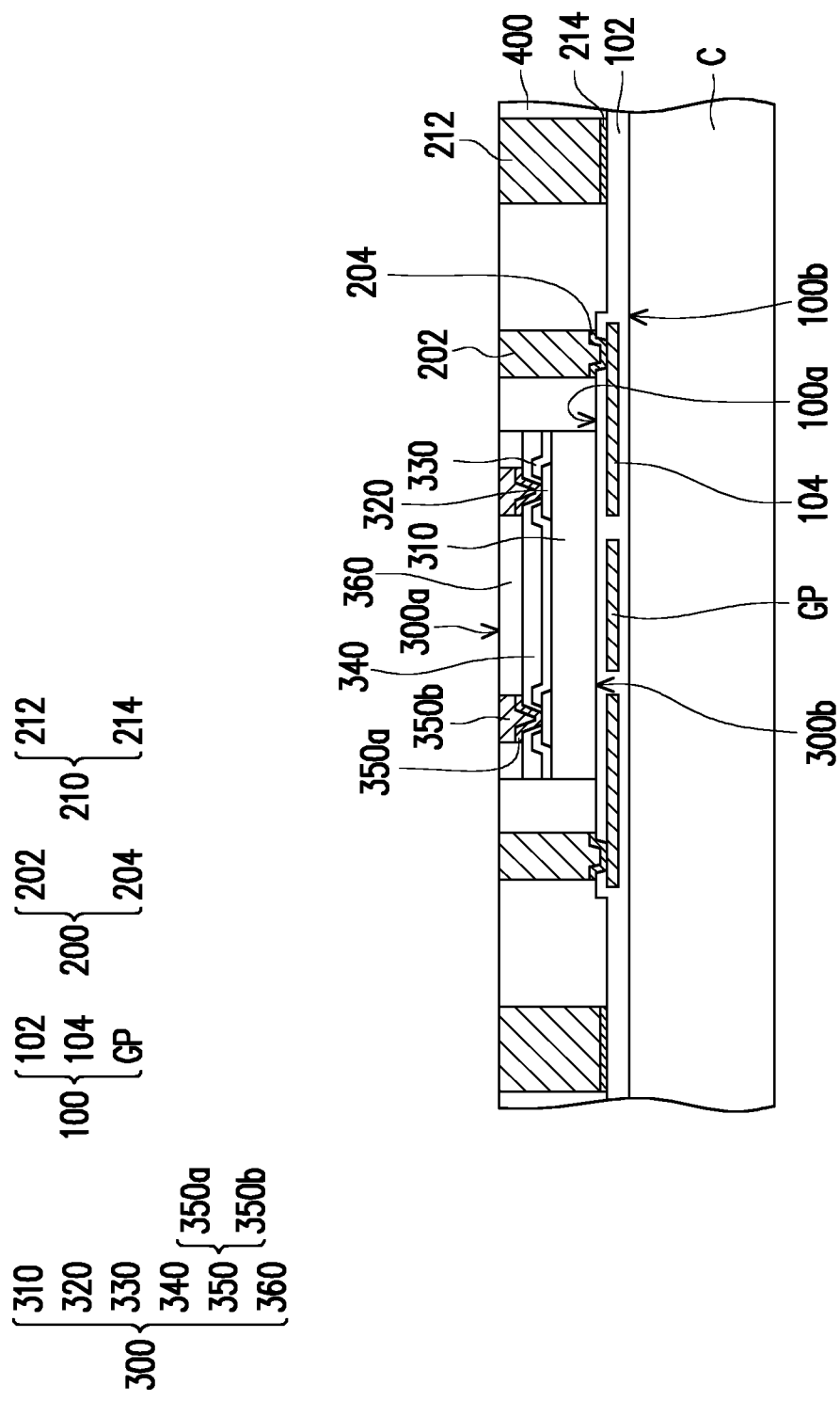

Referring to FIG. 1F, an encapsulant 400 is formed over the first surface 100a of the redistribution structure 100 to encapsulate the dies 300, the conductive through vias 200, and the antenna patterns 210. In other words, the dies 300, the conductive through vias 200, and the antenna patterns 210 are embedded in the encapsulant 400. In some embodiments, the encapsulant 400 includes a molding compound, a molding underfill, a resin (such as epoxy), or the like. In some alternative embodiments, the encapsulant 400 includes a photo-sensitive material such as PBO, PI, benzocyclobutene (BCB), a combination thereof, or the like. In some embodiments, a method of forming the encapsulant 400 includes the following steps. First, an encapsulation material (not shown) is formed on the dielectric layer 102 through, for example, a compression molding process. The dies 300, the conductive through vias 200, and the antenna patterns 210 are encapsulated by the encapsulation material. Thereafter, the encapsulation material is grinded until top surfaces of the conductive pillars 350, top surfaces of the conductive through vias 200, and top surfaces of the antenna patterns 210 are exposed, so as to form the encapsulant 400. In some embodiments, the encapsulant material is grinded by a mechanical grinding process and/or a chemical mechanical polishing (CMP) process. In some embodiments, during the grinding process of the encapsulant material, the protection layer 360 is grinded to reveal the conductive pillars 350. In some embodiments, portions of the conductive through vias 200, portions of the antenna patterns 210, and portions of the conductive pillars 350 are slightly grinded also. After grinding, each die 300 has an active surface 300a and a rear surface 300b opposite to the active surface 300a. The exposed portion of the conductive pillars 350 is located on the active surface 300a of the die 300. On the other hand, the ground plane GP and part of the conductive patterns 104 are located over the rear surface 300b of the die 300. It is noted that since the antenna patterns 210 and the conductive through vias 200 are formed without the presence of residue around themselves as mentioned above, during the process of forming the encapsulant 400, void issue caused by residue may be eliminated, thereby enhancing the reliability and the quality of the subsequently formed package structure 10.

Figure 1G:
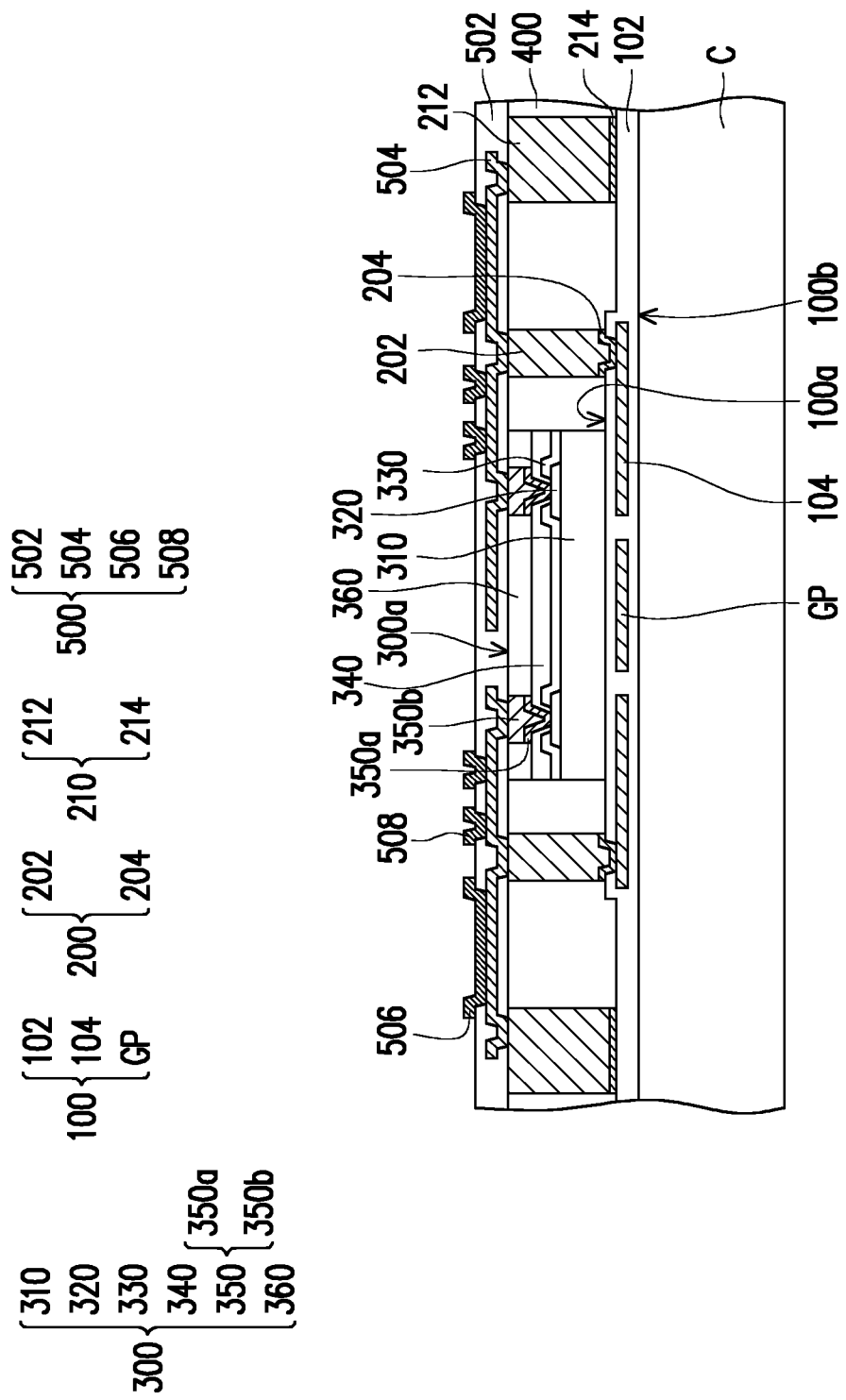

Referring to FIG. 1G, a second redistribution structure 500 is formed on the dies 300, the conductive through vias 200, the antenna patterns 210, and the encapsulant 400. As illustrated in FIG. 1G, the active surface 300a of the die 300 faces the second redistribution structure 500. In other words, the second redistribution structure 500 is disposed on the active surface 300a of the die 300. In some embodiments, the second redistribution structure 500 includes a second dielectric layer 502, a plurality of second conductive patterns 504, a plurality of under-ball metallurgy (UBM) patterns 506, and a plurality of connection pads 508. Similar to the dielectric layer 102, the second dielectric layer 502 may also include multiple dielectric layers. A material of the second dielectric layer 502 is similar to that of the dielectric layer 102, so the detailed description thereof is omitted herein. Similarly, the second conductive patterns 504, the UBM patterns 506, and the connection pads 508 may include the same material as that of the ground plane GP and the conductive patterns 104, so the detailed descriptions thereof are also omitted herein. As shown in FIG. 1G, the second conductive patterns 504 are electrically connected to the conductive pillars 350 of the die 300, the conductive through vias 200, and the antenna patterns 210. In other words, the conductive through vias 200 electrically connect the redistribution structure 100 and the second redistribution structure 500. On the other hand, the antenna patterns 210 are electrically connected to the second redistribution structure 500. In some embodiments, the second conductive patterns 504, the UBM patterns 506, and the connection pads 508 may be collectively referred to as a second conductive pattern layer. The UBM patterns 506 and the connection pads 508 are the topmost conductive patterns in the second conductive pattern layer. For example, the UBM patterns 506 and the connection pads 508 may protrude from the second dielectric layer 502 for receiving subsequently formed component. As illustrated in FIG. 1G, the second redistribution structure 500 may be configured such that the dielectric layer (i.e. the dielectric layer(s) in the second dielectric layer 502) and the second conductive pattern layer (i.e. the second conductive patterns 504, the UBM patterns 506, and the connection pads 508) are stacked in an alternate manner. In some embodiments, the second redistribution structure 500 may be referred to as a front-side redistribution structure.

In some embodiments, the signal output from the dies 300 may be transmitted through portions of the second conductive patterns 504, the conductive through vias 200, and the conductive patterns 104 in sequential order. That is to say, in some embodiments, portions of the second conductive patterns 504, the conductive through vias 200, and the conductive patterns 104 may be collectively referred to as a feed line. In some embodiments, the second redistribution structure 500 is electrically connected to the feed line. It should be noted that the number of the dielectric layers (the second dielectric layer 502) and/or the second conductive pattern layer (i.e. the second conductive patterns 504, the UBM patterns 506, and the connection pads 508) is not limited by the illustration presented in FIG. 1G. In some alternative embodiments, more dielectric layers and/or more conductive pattern layers may be formed to stack alternately.

Figure 1H:
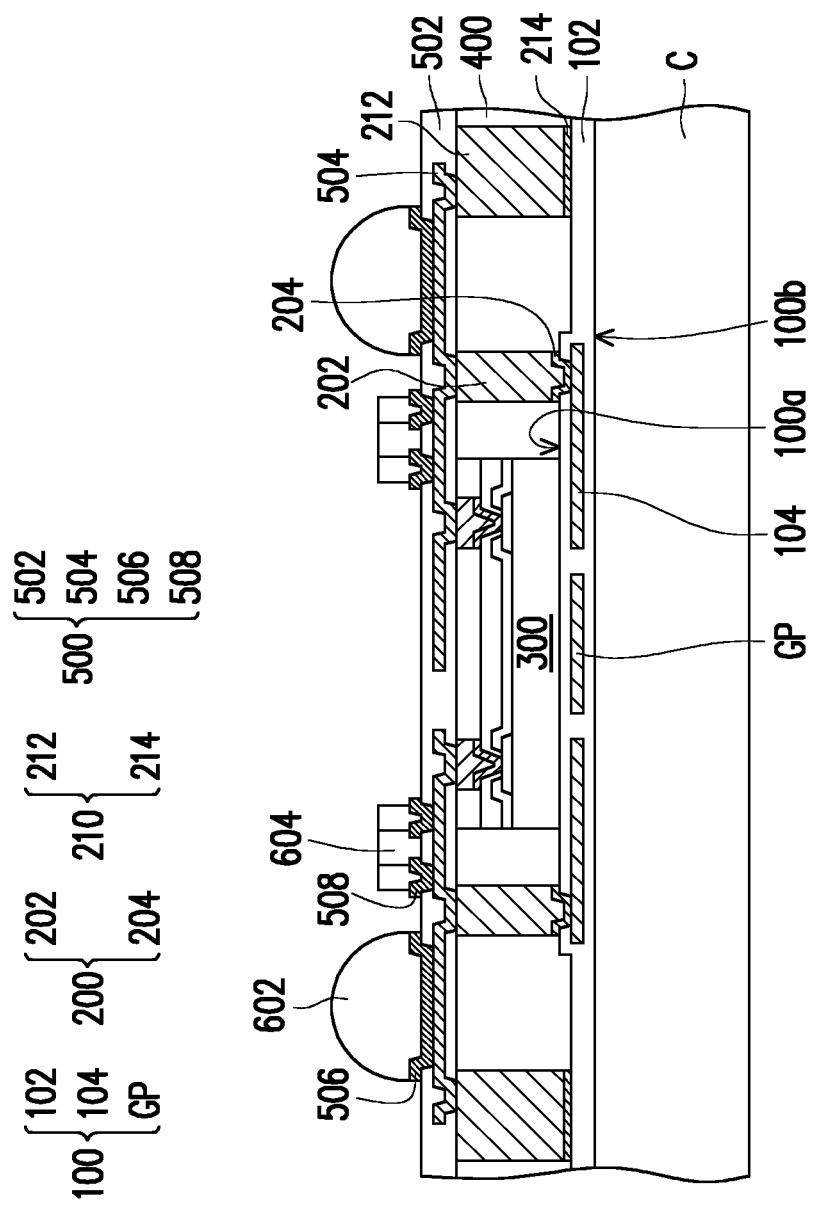
Figure 11:
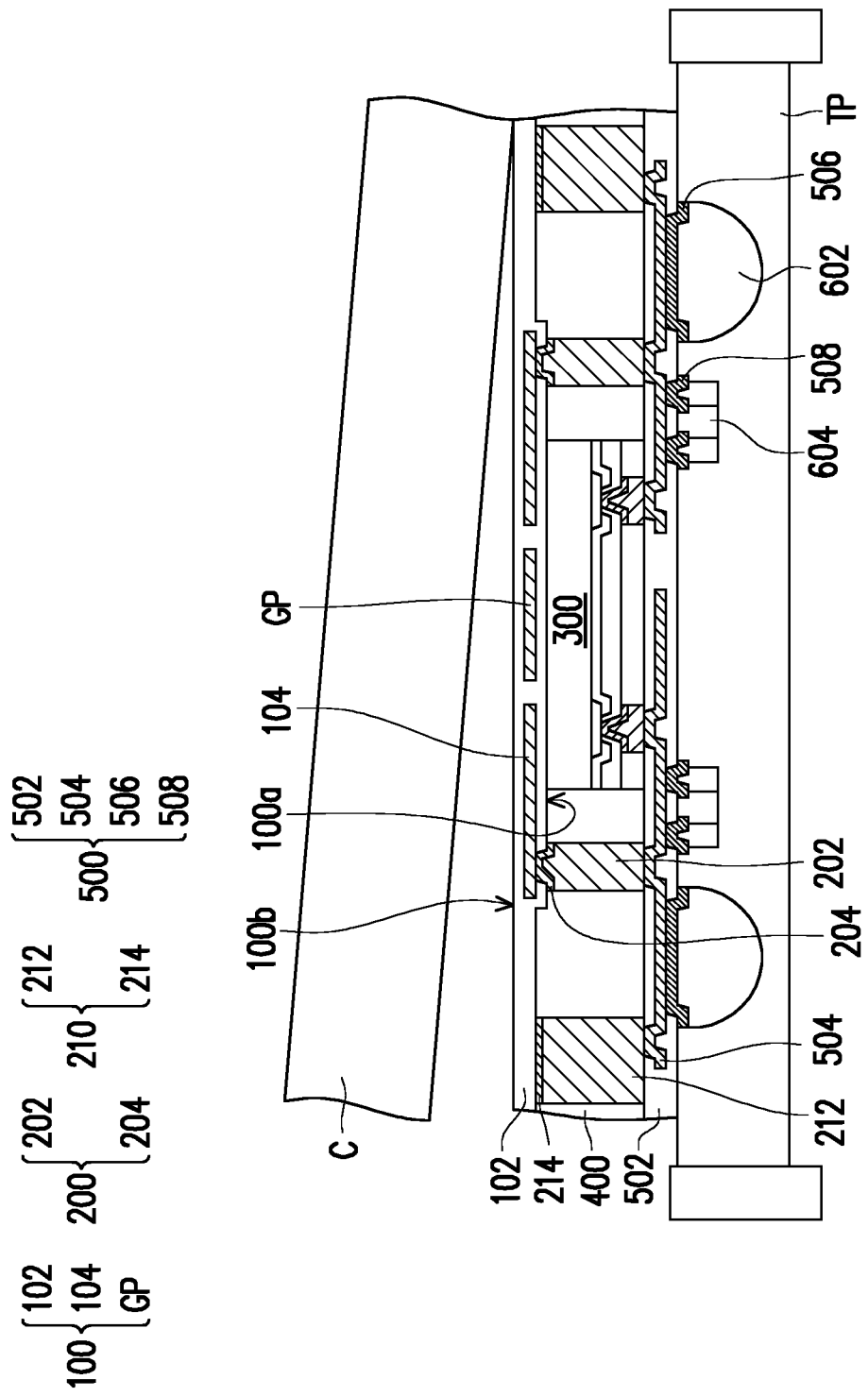

Referring to FIG. 1H, a plurality of conductive terminals 602 and a plurality of passive components 604 are formed on the second redistribution structure 500 opposite to the dies 300. In some embodiments, the conductive terminals 602 are attached to the UBM patterns 506 through a solder flux (not shown). In some embodiments, the conductive terminals 600 are, for example, solder balls, ball grid array (BGA) balls, or C4 bumps. In some embodiments, the conductive terminals 602 are made of a conductive material with low resistivity, such as Sn, Pb, Ag, Cu, Ni, Bi, or an alloy thereof. In some embodiments, the conductive terminals 602 may be disposed on the UBM patterns 506 by a ball placement process and/or a reflow process. In some embodiments, the passive components 604 may be mounted on the connection pads 508 through a soldering process, a reflowing process, or other suitable processes. In some embodiments, the passive components 604 may include capacitors, resistors, inductors, fuses, or the like.

Referring to FIG. 1H and FIG. 1I, the structure illustrated in FIG. 1H is flipped upside down and is attached to a tape TP for further processing. Subsequently, the carrier C is removed. In some embodiments, the de-bonding layer (not shown) may be irradiated by an UV laser such that the redistribution structure 100 is de-bonded from the carrier C.

Figure 1J:
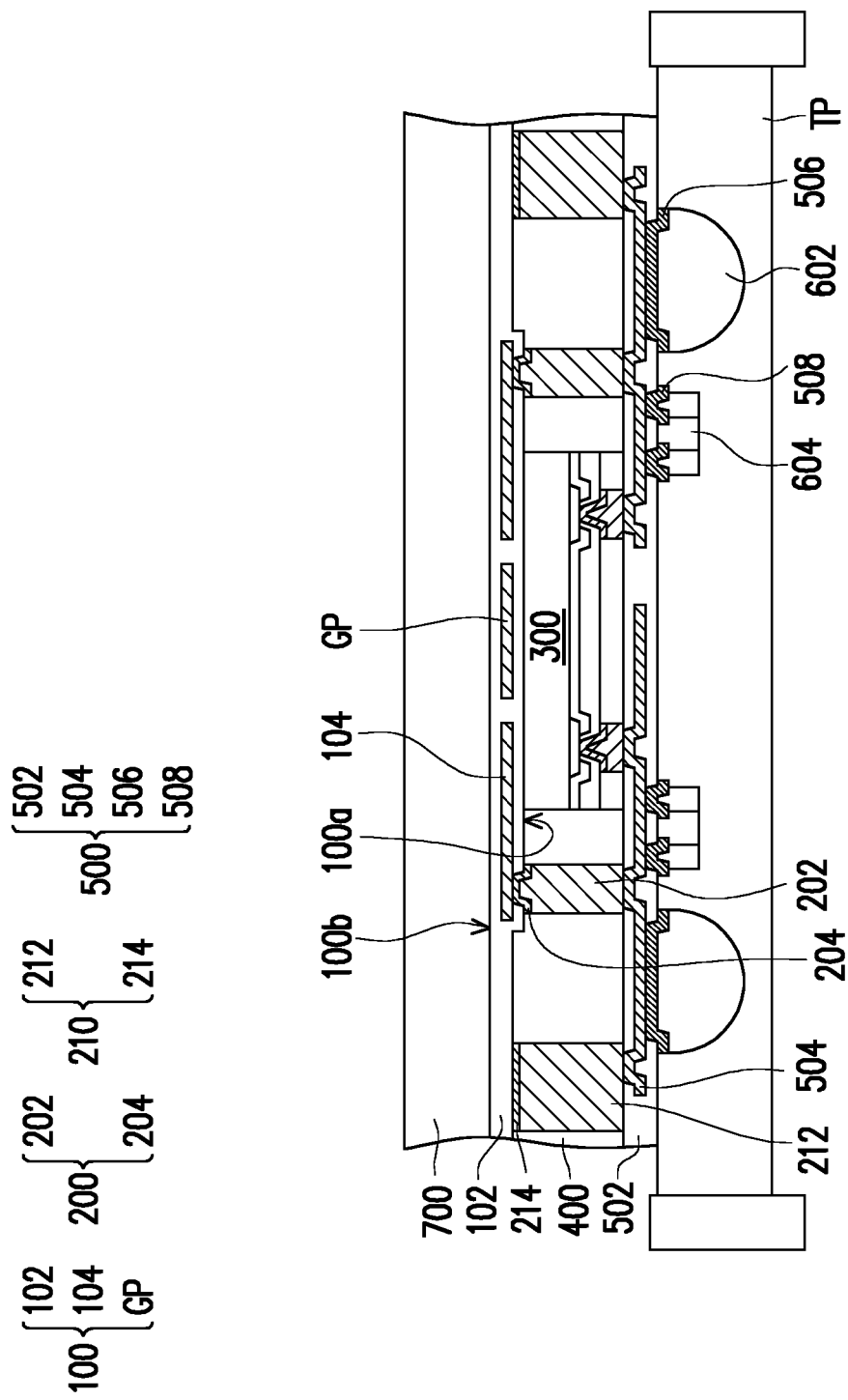

Referring to FIG. 1J, an insulating layer 700 is disposed on the redistribution structure 100 opposite to the dies 300. In some embodiments, the insulating layer 700 is a polymer layer. For example, the insulating layer 700 includes a photo-sensitive material such as PBO, PI, BCB, a combination thereof, or the like. In some alternative embodiments, the insulating layer 700 includes epoxy resins or any other suitable type of molding materials. In some embodiments, the material of the insulating layer 700 has a low dissipation factor (Df) and/or a low permittivity (Dk). Depending on the frequency range of high-speed applications, suitable materials of the insulating layer 700 may be selected based on the required electrical properties of the subsequently formed package structure 10. The insulating layer 700 is formed by a suitable fabrication technique such as spin-coating, lamination, deposition or the like. In some embodiments, a thickness of the insulating layer 700 may range between about 200 μm and about 2 mm.

Figure 1K:
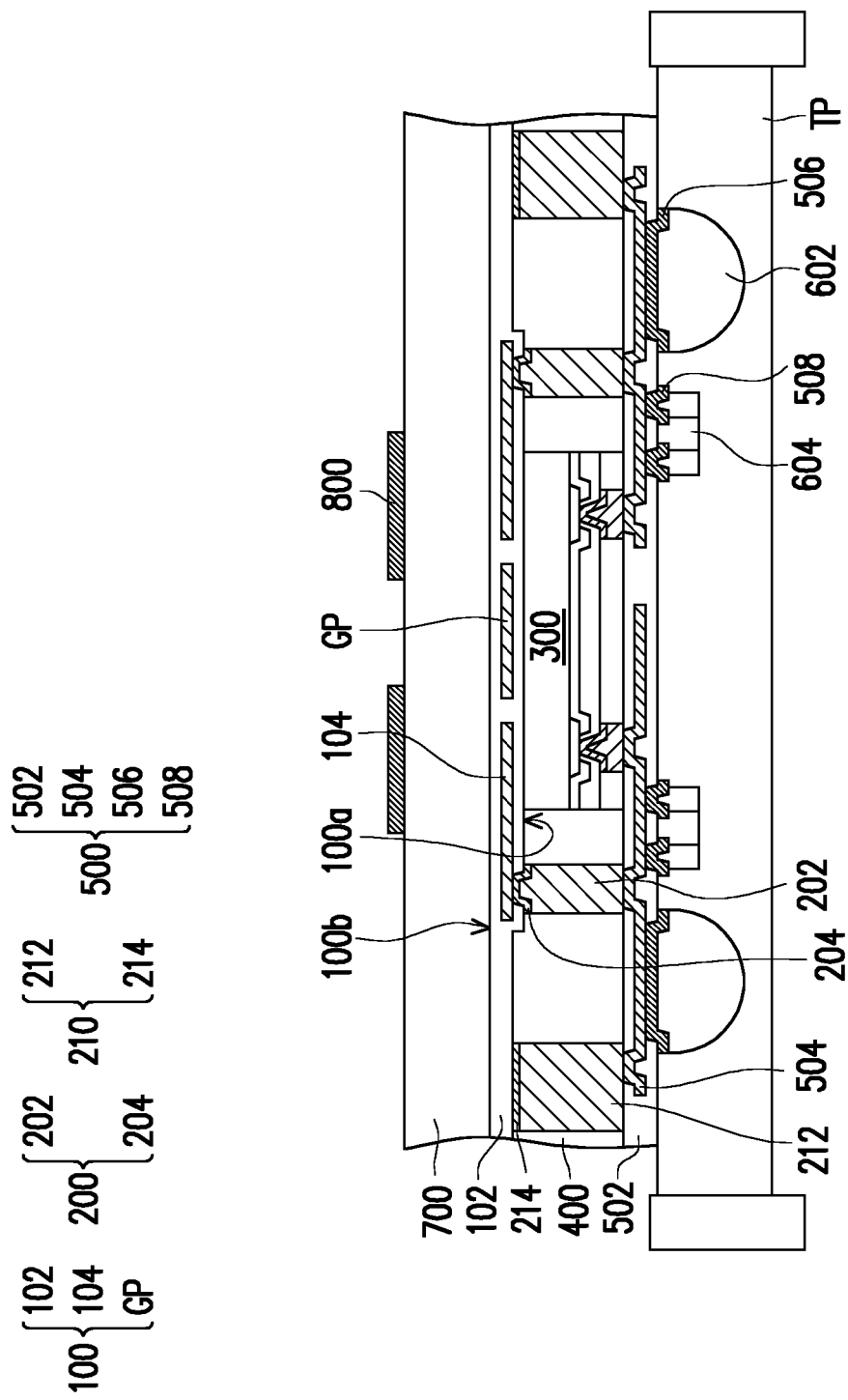

Referring to FIG. 1K, a plurality of conductive patches 800 is formed on the insulating layer 700. In some embodiments, a vertical projection of the conductive patches 800 onto the redistribution structure 100 in the thickness direction of the insulating layer 700 is partially overlapped with the ground plane GP. In some embodiments, the conductive patches 800 are formed by forming a metallization layer (not shown) through electroplating or deposition over the insulating layer 700 and then patterning the metallization layer by a photolithography and etching processes. In some alternative embodiments, the conductive patches 800 may be formed by printing a plurality of metallization patterns directly onto the insulating layer 700. For example, metallic paste may be printed onto the insulating layer 700 and cured to form the conductive patches 800. In some embodiments, a material of the conductive patches 800 includes aluminum, titanium, copper, nickel, tungsten, and/or alloys thereof. In some embodiments, the conductive patches 800 may be electrically coupled to the conductive patterns 104 (portions of the feed line) of the redistribution structure 100. In other words, the signal transmitted in the conductive patterns 104 may be electrically coupled to the conductive patches 800 such that the conductive patches 800 may be referred to as patch antennas. It should be noted that in some embodiments, formation of the insulating layer 700 and the conductive patches 800 may be optional.

Figure 1L:
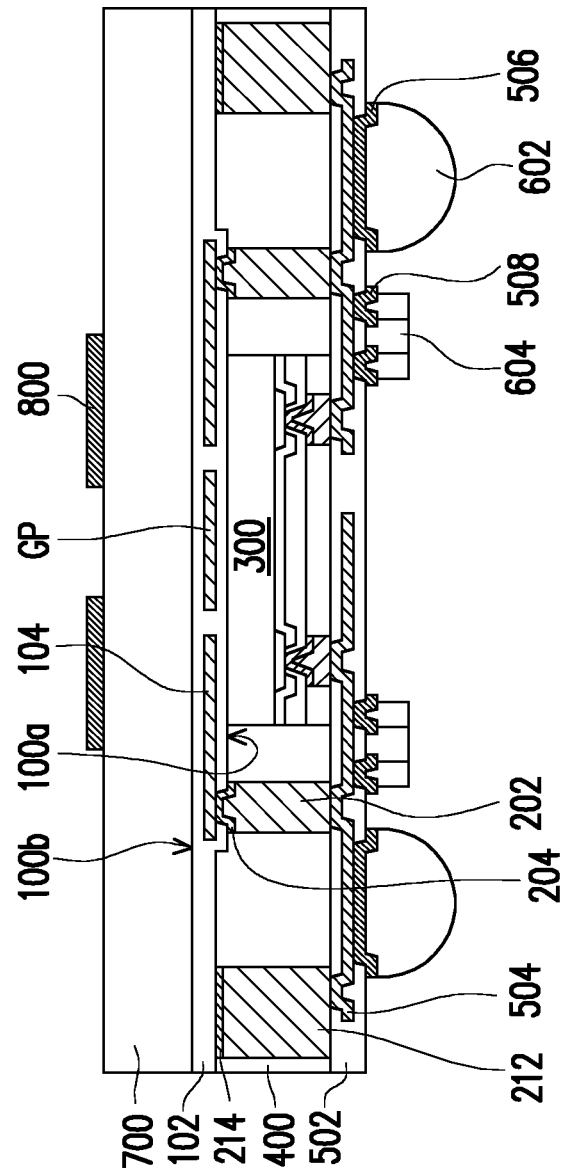

Referring to FIG. 1K and FIG. 1L, the tape TP is removed and the structure illustrated in FIG. 1K may undergo a singulation process to form the package structure 10 illustrated in FIG. 1L. 7

Figures 7A, 7B:
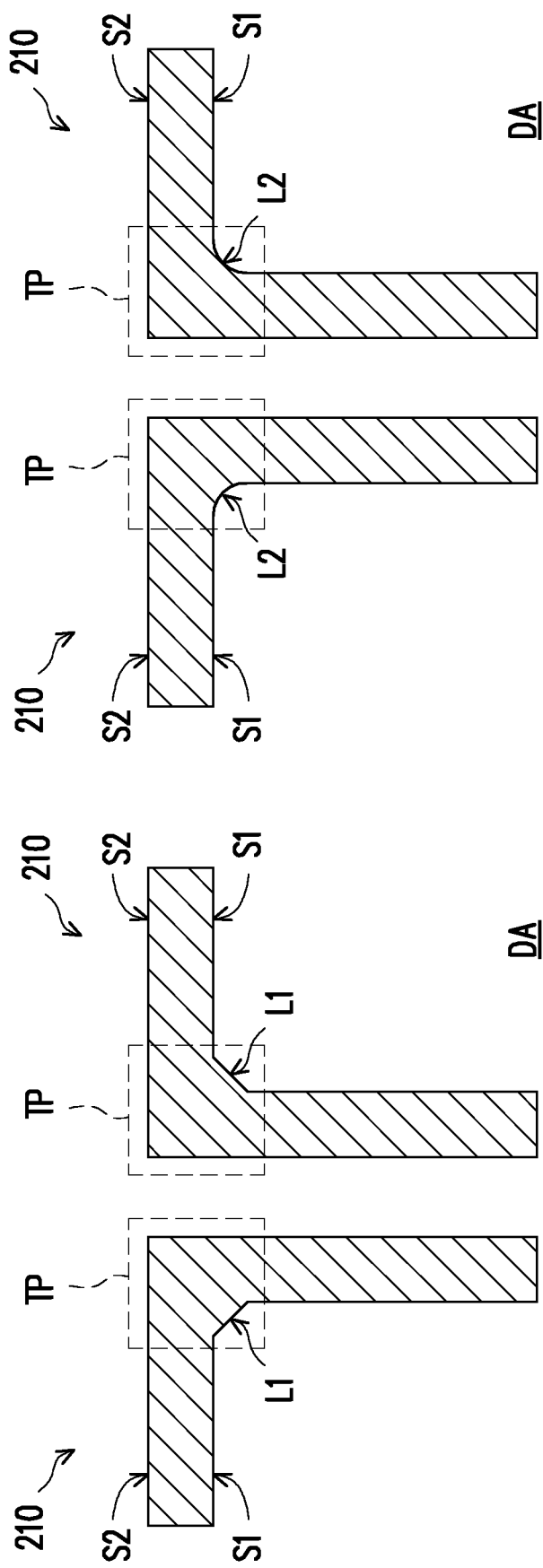
FIG. 7A is a schematic top view illustrating a dipole antenna in accordance with some alternative embodiments of the disclosure.
FIG. 7B is a schematic top view illustrating a dipole antenna in accordance with some alternative embodiments of the disclosure.

Although in the package structure 10, the first sidewall S1 of each antenna pattern 210 is formed to have the included angle θ of about 90° or less at the turning portion TP, but the disclosure is not limited thereto. In some alternative embodiments, the first sidewall S1 of each antenna pattern 210 is formed to have a slant line L1 at the turning portion TP, as illustrated in FIG. 7A. In some alternative embodiments, the first sidewall S1 of each antenna pattern 210 is formed to have a curve line L2 at the turning portion TP, as illustrated in FIG. 7B.

Figure 8:
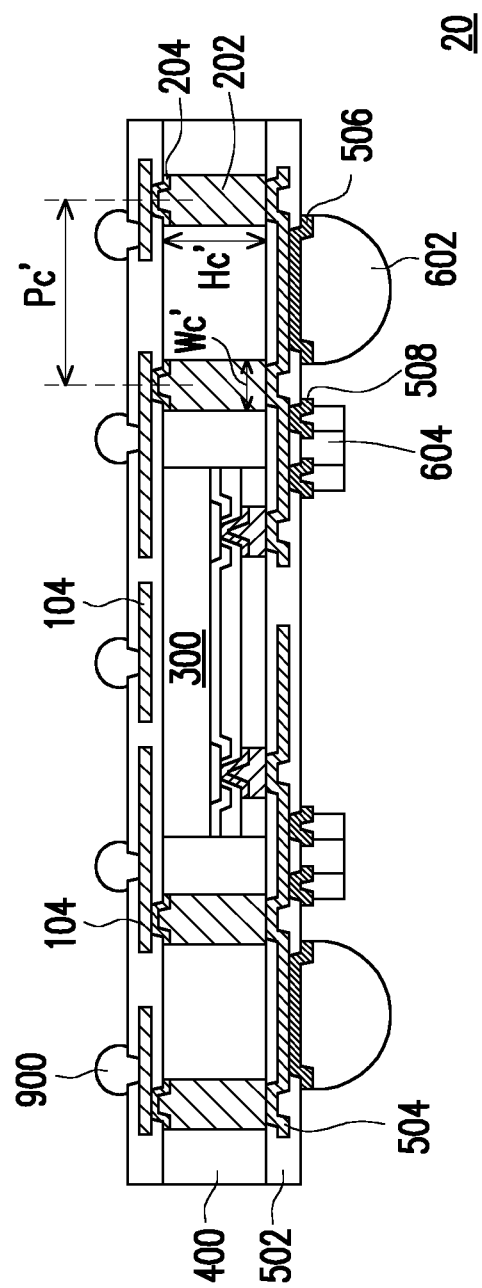
FIG. 8 is a schematic cross-sectional view illustrating a package structure in accordance with some alternative embodiments of the disclosure.

FIG. 8 is a schematic cross-sectional view illustrating a package structure in accordance with some alternative embodiments of the disclosure. Referring to FIG. 8 and FIG. 1L, a package structure 20 in FIG. 8 is similar to the package structure 10 in FIG. 1L, so similar components are denoted by similar reference numerals, and the detailed descriptions thereof are omitted herein. The main difference between the package structure 20 in FIG. 8 and the package structure 10 in FIG. 1L lies in that the antenna patterns, the ground plane, the conductive patches and the insulating layer on which the conductive patches are disposed are omitted in the package structure 20. In addition, the package structure 20 further includes a plurality of conductive terminals 900 disposed on the redistribution structure 100 opposite to the die 300. In some embodiments, the conductive terminals 900 are directly in contact with the conductive patterns 104 to render electrical connection with the redistribution structure 100. In some embodiments, the conductive terminals 900 are, for example, solder balls, ball grid array (BGA) balls, or C4 bumps. In some embodiments, the conductive terminals 900 are made of a conductive material with low resistivity, such as Sn, Pb, Ag, Cu, Ni, Bi, or an alloy thereof. In some embodiments, the conductive terminals 900 may be formed through a ball placement process and/or a reflow process.

It is noted that although in the package structure 20, the antenna patterns are omitted and only the conductive through vias 200 and the die 300 are embedded in the encapsulant 400, according to the descriptions with respect to FIGS. 1A-1D, 3A-3D, 4A-4D, 5A-5C and 6A-6C, those skilled in the art should understand that the method described above in conjunction with FIGS. 3A-3D and 4A-4D or the method described above in conjunction with FIGS. 5A-5C and 6A-6C can be applied to manufacture the conductive through vias 200 of the package structure 20. In this way, the conductive through vias 200 of the package structure 20 can be formed without the presence of residue around themselves and the critical dimension (CD) control of the conductive through vias 200 in the package structure 20 can be optimized. As a result, the performance and the quality of the package structure 20 may be ensured.

In some embodiments, in the package structure 20, a pitch Pc' of two adjacent conductive through vias 200 ranges between about 20 μm and about 100 μm. In certain embodiments, in the package structure 20, the pitch Pc' of two adjacent conductive through vias 200 ranges between about 20 μm and about 60 μm. That is to say, when the method described above in conjunction with FIGS. 3A-3D and 4A-4D or the method described above in conjunction with FIGS. 5A-5C and 6A-6C is applied to manufacture the conductive through vias 200 of the package structure 20, the conductive through vias 200 can be formed to have high distribution density. Further, in some embodiments, in the package structure 20, a height Hc' of each conductive through via 200 ranges between about 10 μm and about 150 μm, and a width Wc' of each conductive through via 200 ranges between about 1 μm and about 50 μm. Furthermore, in some embodiments, in the package structure 20, an aspect ratio (i.e., a ratio of the height Hc' to the width Wc') of each conductive through via 200 ranges between about 1 and about 10. In certain embodiments, in the package structure 20, the aspect ratio of each conductive through via 200 ranges between about 8 and about 10. That is to say, when the method described above in conjunction with FIGS. 3A-3D and 4A-4D or the method described above in conjunction with FIGS. 5A-5C and 6A-6C is applied to manufacture the conductive through vias 200 of the package structure 20, the conductive through vias 200 of the package structure 20 can be formed to have high aspect ratio.

In some alternative embodiments, the package structure 20 may be further mounted with a circuit substrate, an interposer, an additional package, a memory device, chips/dies or other electronic devices to form a stacked package structure through the conductive terminals 900 and/or other additional connectors based on the design layout and the demand. For illustration, an example is provided below in conjunction with FIG. 9, but the disclosure is not limited thereto.

Figure 9:
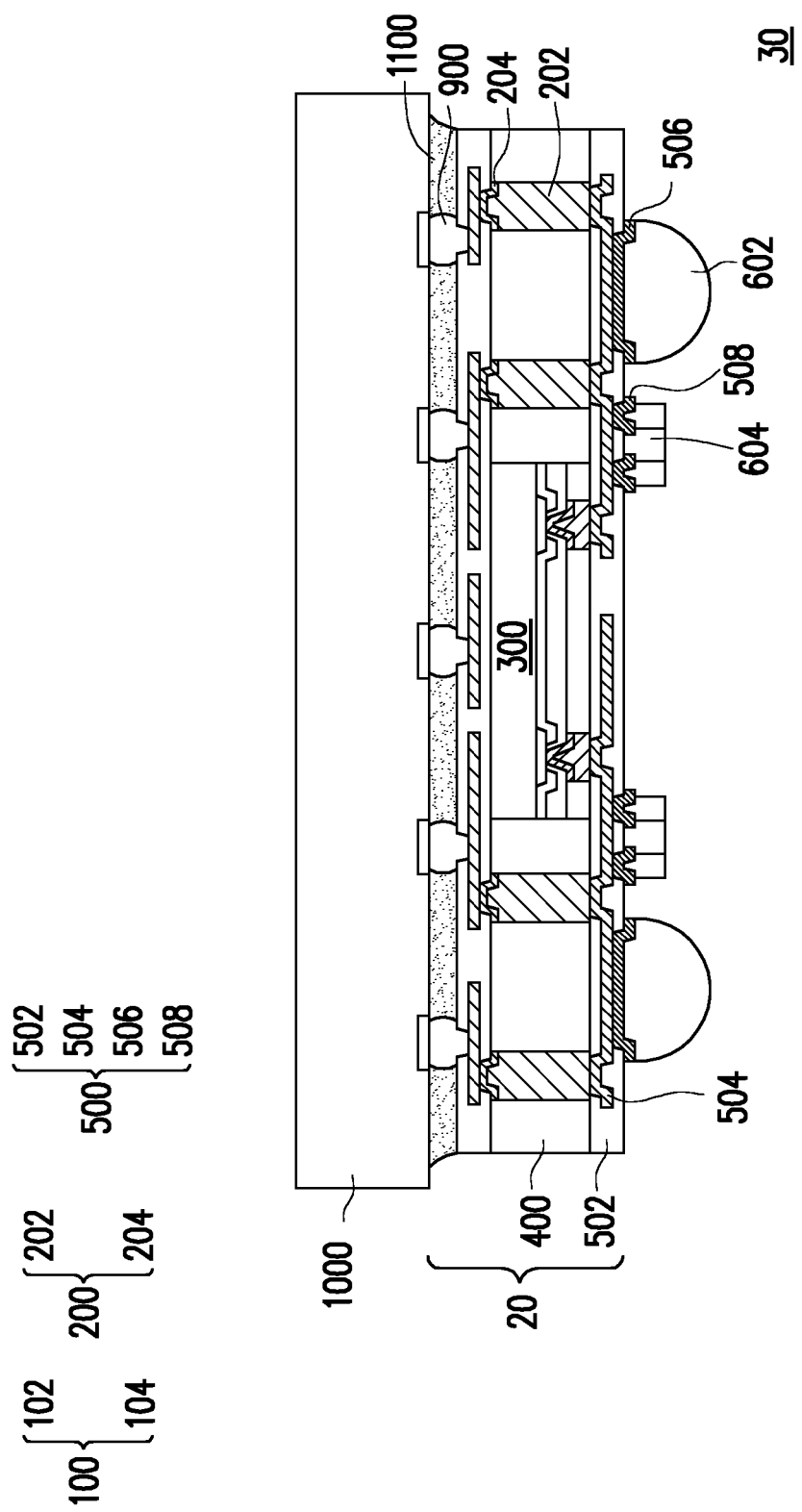
FIG. 9 is a schematic cross-sectional view illustrating a package structure in accordance with some alternative embodiments of the disclosure.

FIG. 9 is a schematic cross-sectional view illustrating a package structure in accordance with some alternative embodiments of the disclosure. Referring to FIG. 9 and FIG. 8, a package structure 30 in FIG. 9 is similar to the package structure 20 in FIG. 8, so similar components are denoted by similar reference numerals, and the detailed descriptions thereof are omitted herein. The main difference between the package structure 30 in FIG. 9 and the package structure 20 in FIG. 8 lies in that in the package structure 30, the package structure 20 is mounted on an electronic device 1000 through the conductive terminals 900. The electronic device 1000 is, for example, a circuit substrate, an interposer, an additional package, or a memory device. In detail, the conductive terminals 900 are, for example, reflowed to bond with and electrically connect to the electronic device 1000 such that the package structure 20 is electrically connected to the electronic device 1000.

After the electrical bonding of the package structure 20 and the electronic device 1000 is accomplished, an underfill 1100 is formed between the package structure 20 and the electronic device 1000 to enhance the bonding strength between the package structure 20 and the electronic device 1000. As shown in FIG. 9, the underfill 110 at least fills the gap between the package structure 20 and the electronic device 1000, and encapsulates the conductive terminals 900. In some alternative embodiments, a sidewall of the package structure 20 may further be covered by the underfill 1100 for enhancing the reliability of the package structure 30. In some embodiments, the underfill 1100 includes a molding compound, a molding underfill, a resin (such as epoxy), or the like. In some embodiments, the underfill 1100 may be formed by underfill dispensing or any other suitable method.

Figure 10C:
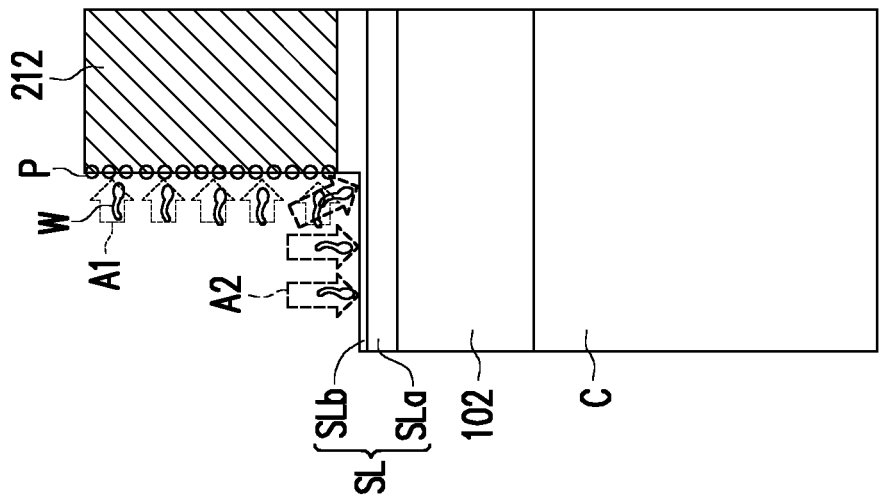
FIG. 10A to FIG. 10E are cross-sectional views illustrating a etching process in a manufacturing process of antenna patterns in accordance with some alternative embodiments of the disclosure.
Figure 10B:
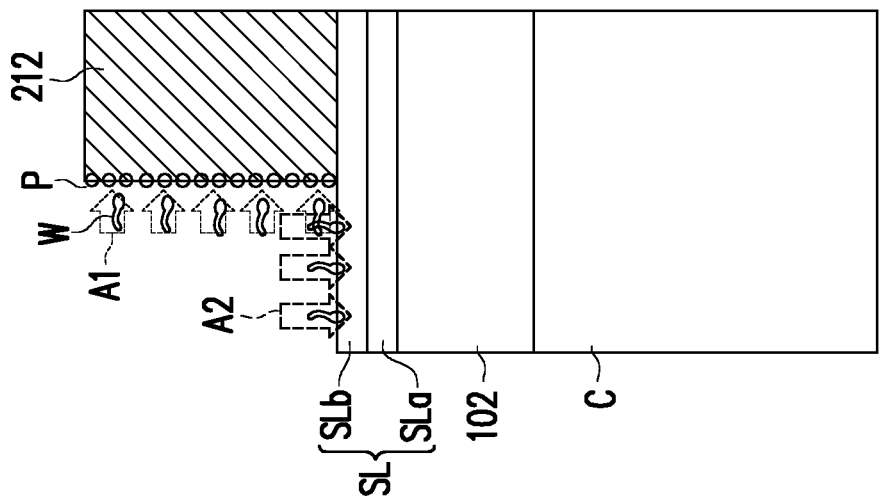
Figure 10A:
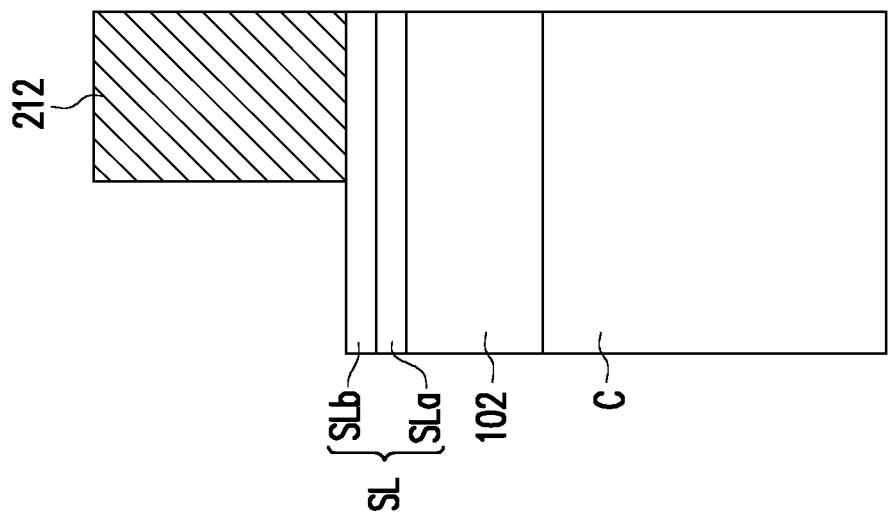
Figure 10E:
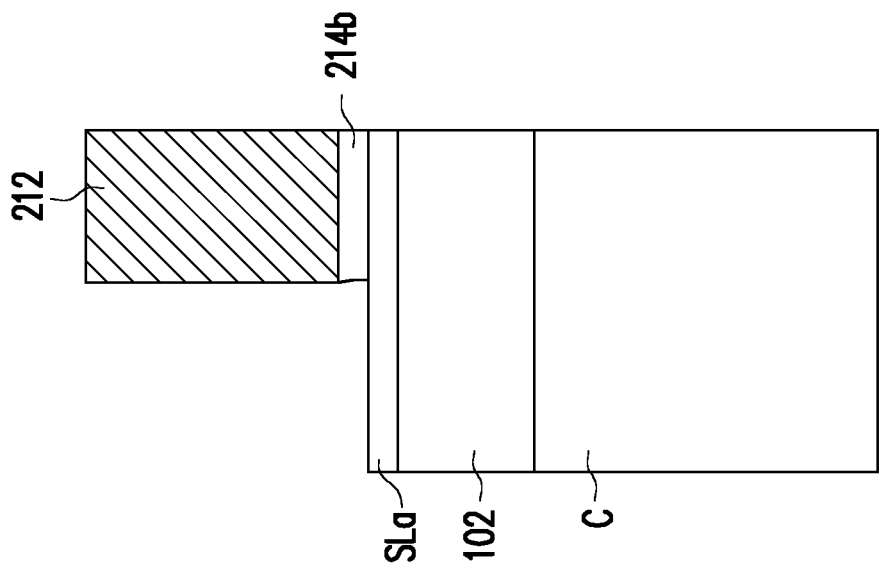
Figure 10D:
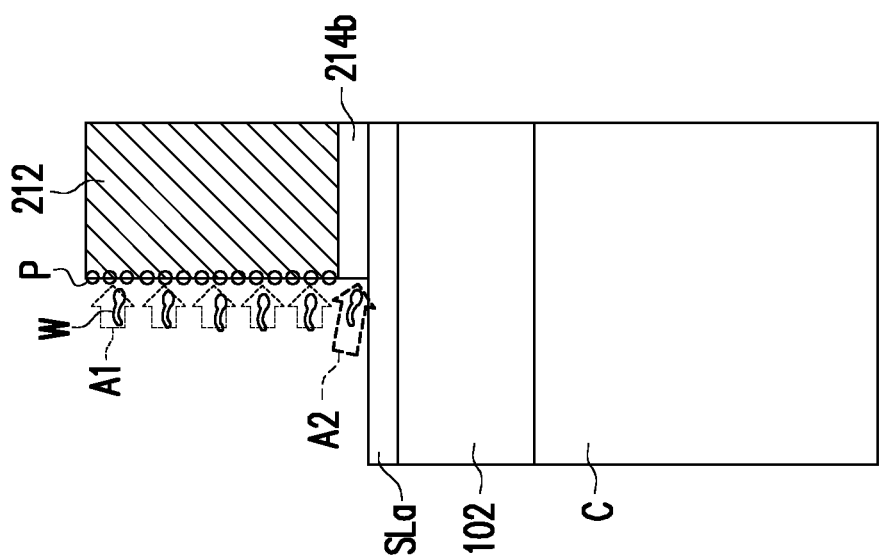

FIG. 10A to FIG. 10E are cross-sectional views illustrating an etching process in a manufacturing process of antenna patterns in accordance with some alternative embodiments of the disclosure. Referring to FIG. 10A to FIG. 10E, during the etching process (e.g., the etching process E2 or the etching process E4), the protective agent P in the etchant provides a function of protecting the conductive pattern 212, and the wetting agent W in the etchant provides a function of helping the etchant to smoothly distribute along the conductive pattern 212 and the second seed layer SLb. As such, during the etching process with the etchant including: 0.1 wt % to 10 wt % of phosphoric acid ($H_3PO_4$), 0.1 wt % to 10 wt % of hydrogen peroxide ($H_2O_2$), 1 ppm to 20000 ppm of the protective agent P, 1 ppm to 20000 ppm of the wetting agent W, and a balance amount of a solvent, the vector of etching performance (marked as the arrow A1) with respect to the conductive pattern 212 is quite different form the vector of etching performance (marked as the arrow A2) with respect to the second seed layer SLb. Specifically, as shown in FIG. 10B, FIG. 10C and FIG. 10D, the etching ability of the etchant to the conductive pattern 212 is much weaker that the etching ability of the etchant to the second seed layer SLb, and the wetting ability of the etchant to the second seed layer SLb exposed by the conductive patterns 212 is good. As a result, during the etching process, the conductive patterns 212 is slightly etched while a portion of the second seed layer SLb exposed by the conductive patterns 212 is sufficiently removed. Further, as shown in FIG. 10D and FIG. 10E, during the etching process, a reentrant profile with an undercut is formed in a lower sidewall of the seed layer pattern 214b.

In accordance with some embodiments of the disclosure, a method including the following steps is provided. A seed layer is formed. Conductive patterns are formed on the seed layer. An etching process with an etchant is performed to remove a portion of the seed layer exposed by the conductive patterns, wherein the etchant includes: 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent, and a balance amount of a solvent.

In accordance with some alternative embodiments of the disclosure, a method including the following steps is provided. A die and antenna patterns are laterally encapsulated with an encapsulant, wherein a method of forming the antenna patterns includes: forming a seed layer; forming conductive patterns on a first portion of the seed layer; and performing a first etching process with a first etchant to remove a second portion of the seed layer exposed by the conductive patterns, wherein the first etchant includes: 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent, and a balance amount of a solvent.

In accordance with some alternative embodiments of the disclosure, a method including the following steps is provided. Antenna patterns and conductive through vias are formed on a carrier. A die is provided on the carrier. The die, the antenna patterns and the conductive through vias are laterally encapsulated with an encapsulant, wherein forming the antenna patterns and the conductive through vias on the carrier includes: forming a seed layer on the carrier, wherein the seed layer includes a first seed layer and a second seed layer on the first seed layer; forming conductive patterns on the seed layer; and performing a first etching process with a first etchant to remove a portion of the second seed layer exposed by the conductive patterns, wherein the first etchant includes: 0.1 wt % to 10 wt % of phosphoric acid ($H_3PO_4$), 0.1 wt % to 10 wt % of hydrogen peroxide ($H_2O_2$), 1 ppm to 20000 ppm of a protective agent, 1 ppm to 20000 ppm of a wetting agent, and a balance amount of a solvent.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a seed layer;
   forming conductive patterns on the seed layer; and
   performing an etching process with an etchant to remove a portion of the seed layer exposed by the conductive patterns, wherein the etchant comprises:
   0.1 wt % to 10 wt % of phosphoric acid ($H_3PO_4$);
   0.1 wt % to 10 wt % of hydrogen peroxide ($H_2O_2$);
   1000 ppm to 6000 ppm of a protective agent;
   1000 ppm to 6000 ppm of a wetting agent; and
   a balance amount of a solvent.

2. The method according to claim 1, wherein the protective agent comprises alkylamine, amino acid or azole compound, and the wetting agent comprises non-ionic type compound or anionic type compound.

3. The method according to claim 1, wherein at least one of the conductive patterns comprises an antenna pattern formed with a turning portion, and the at least one of the conductive patterns is formed with an aspect ratio ranging between about 1 and about 10.

4. The method according to claim 1, wherein the conductive patterns comprise conductive through vias formed in an array, and a pitch of two adjacent conductive patterns among the conductive patterns ranges between about 20 μm and about 400 μm.

5. The method according to claim 1, wherein the conductive patterns comprise conductive pillars formed in an array, and a pitch of two adjacent conductive patterns among the conductive patterns ranges between about 10 μm and about 80 μm.

6. The method according to claim 3, wherein the portion of the seed layer exposed by the conductive patterns is formed in proximity to the turning portion.

7. A method, comprising:
   laterally encapsulating a die and antenna patterns with an encapsulant, wherein a method of forming the antenna patterns comprises:
   forming a seed layer;
   forming conductive patterns on a first portion of the seed layer; and
   performing a first etching process with a first etchant to remove a second portion of the seed layer exposed by the conductive patterns, wherein the first etchant comprises:
   0.1 wt % to 10 wt % of phosphoric acid ($H_3PO_4$);
   0.1 wt % to 10 wt % of hydrogen peroxide ($H_2O_2$);
   1 ppm to 20000 ppm of a protective agent;
   1 ppm to 20000 ppm of a wetting agent; and
   a balance amount of a solvent, wherein the protective agent comprises alkylamine, amino acid or azole compound, and the wetting agent comprises non-ionic type compound or anionic type compound.

8. The method according to claim 7, wherein at least one of the antenna patterns is formed with an aspect ratio (height to width) ranging between about 1 and about 10.

9. The method according to claim 7, wherein the method of forming the antenna patterns further comprises:
   performing a second etching process with a second etchant on the seed layer before performing the first etching process with the first etchant and after forming the conductive patterns on the seed layer, wherein the first etchant is different from the second etchant.

10. The method according to claim 9, wherein the second etchant comprises:
    0.1 wt % to 10 wt % of phosphoric acid ($H_3PO_4$);
    0.1 wt % to 10 wt % of hydrogen peroxide ($H_2O_2$); and
    a balance amount of a solvent.

11. The method according to claim 7, wherein the second portion of the seed layer exposed by the conductive material layer is formed in proximity to a turning portion of at least one of the conductive patterns.

12. The method according to claim 7, wherein the etchant comprises 0.5 wt % to 6 wt % of phosphoric acid, 0.5 wt % to 6 wt % of hydrogen peroxide, 1000 ppm to 6000 ppm of the protective agent, and 1000 ppm to 6000 ppm of the wetting agent.

13. A method, comprising:
    forming antenna patterns and conductive through vias on a carrier;
    providing a die on the carrier; and
    laterally encapsulating the die, the antenna patterns and the conductive through vias with an encapsulant, wherein forming the antenna patterns and the conductive through vias on the carrier comprises:
    forming a seed layer on the carrier, wherein the seed layer comprises a first seed layer and a second seed layer on the first seed layer;
    forming conductive patterns on the seed layer; and
    performing a first etching process with a first etchant to remove a portion of the second seed layer exposed by the conductive patterns, wherein the first etchant comprises:
    0.1 wt % to 10 wt % of phosphoric acid ($H_3PO_4$);
    0.1 wt % to 10 wt % of hydrogen peroxide ($H_2O_2$);
    1 ppm to 20000 ppm of a protective agent;
    1 ppm to 20000 ppm of a wetting agent; and
    a balance amount of a solvent.

14. The method according to claim 13, wherein the protective agent comprises alkylamine, amino acid or azole compound, and the wetting agent comprises non-ionic type compound or anionic type compound.

15. The method according to claim 13, wherein the conductive patterns and the second seed layer comprise a same material.

16. The method according to claim 15, wherein the seed layer is formed by a sputtering process, and the conductive patterns are formed by a plating process.

17. The method according to claim 13, wherein forming the antenna patterns and the conductive through vias on the carrier further comprises:
    performing a second etching process with a second etchant to remove a portion of the first seed layer exposed by the conductive patterns after performing the first etching process with the first etchant, wherein the first etchant is different from the second etchant.

18. The method according to claim 17, wherein the second etchant comprises:

0.1 wt % to 5 wt % of hydrogen fluoride (HF); and
a balance amount of a solvent.

19. The method according to claim 17, wherein forming the antenna patterns and the conductive through vias on the carrier further comprises:
  performing a third etching process with a third etchant on the second seed layer before performing the first etching process with the first etchant and after forming the conductive patterns on the seed layer, wherein the first etchant is different from the third etchant.

20. The method according to claim 19, wherein a process time of the first etching process is different from a process time of the third etching process, a process temperature of the first etching process is different from a process temperature of the third etching process.

* * * * *